US010672473B2

(12) United States Patent
Nakazato et al.

(10) Patent No.: US 10,672,473 B2
(45) Date of Patent: Jun. 2, 2020

(54) SEMICONDUCTOR MEMORY DEVICE

(71) Applicant: TOSHIBA MEMORY CORPORATION, Tokyo (JP)

(72) Inventors: Takaaki Nakazato, Yokohama Kanagawa (JP); Atsushi Kawasumi, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/120,410

(22) Filed: Sep. 3, 2018

(65) Prior Publication Data

US 2019/0287616 A1 Sep. 19, 2019

(30) Foreign Application Priority Data

Mar. 15, 2018 (JP) ................................ 2018-048446

(51) Int. Cl.
*G11C 13/00* (2006.01)

(52) U.S. Cl.
CPC ...... *G11C 13/0069* (2013.01); *G11C 13/0004* (2013.01); *G11C 13/004* (2013.01); *G11C 13/0026* (2013.01); *G11C 13/0028* (2013.01); *G11C 2013/0078* (2013.01); *G11C 2013/0092* (2013.01); *G11C 2213/79* (2013.01)

(58) Field of Classification Search
None
See application file for complete search history.

(56) References Cited

U.S. PATENT DOCUMENTS 9,443,588 B2 9/2016 Tseng et al.

FOREIGN PATENT DOCUMENTS

JP 2014522485 * 2/2014
WO 2014002656 A1 1/2014

* cited by examiner

*Primary Examiner* — James G Norman
(74) *Attorney, Agent, or Firm* — Kim & Stewart LLP

(57) ABSTRACT

A semiconductor memory device includes a first conductor that extends in a first direction, a second conductor that extends in a second direction, a first memory cell connected between the first conductor and the second conductor and including a phase change element, and a control circuit. The control circuit applies a first voltage across the first memory cell via the first conductor and the second conductor during a first period of time of a write operation targeted to the first memory cell, and a second voltage across the first memory cell via the first conductor and the second conductor during a second period of time of the write operation after the first period. The first voltage is an overshoot voltage. The second voltage is a preset voltage having a magnitude sufficient to place the phase change element in a molten state during the second period of time.

18 Claims, 17 Drawing Sheets

31
BIT LINE CONTROL CIRCUIT
311
COLUMN DECODER
FROM ADDRESS REGISTER 5
315
WAVEFORM GENERATION CIRCUIT
FROM POWER SUPPLY DRIVE CIRCUIT 7
TM1
TM2
FROM WRITE CONTROL CIRCUIT 84
ϕBL-1
ϕBL-(k-1)
ϕBL-k
ϕBL-(k+1)
ϕBL-M
312-1
312-(k-1)
312-k
312-(k+1)
312-M
313-1
313-(k-1)
313-k
313-(k+1)
313-M
314-1
314-(k-1)
314-k
314-(k+1)
314-M
BL-1
BL-(k-1)
BL-k
BL-(k+1)
BL-M

SEMICONDUCTOR MEMORY DEVICE

CROSS-REFERENCE TO RELATED APPLICATIONS

This application is based upon and claims the benefit of priority from Japanese Patent Application No. 2018-048446, filed Mar. 15, 2018, the entire contents of which are incorporated herein by reference.

FIELD

Embodiments described herein relate generally to a semiconductor memory device.

BACKGROUND

In a semiconductor memory device having memory cells that includes a phase change element, the memory cell is switched back and forth between a high resistance state (reset state) or a low resistance state (set state) to store information in the memory cell. The change in states results from a change in magnitude of a voltage applied across the phase change element and the speed of this change.

DETAILED DESCRIPTION

Figure 1:
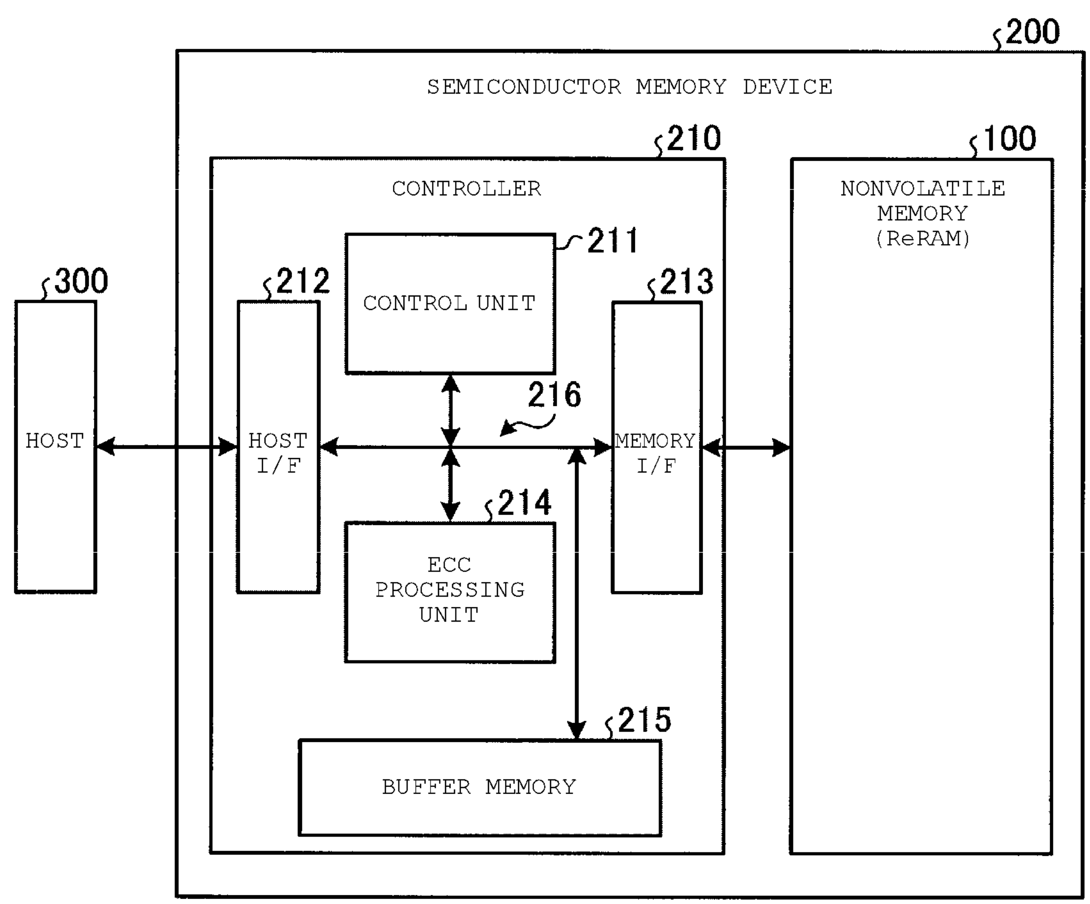
FIG. 1 is a diagram illustrating a semiconductor memory device according to an embodiment.

In general, according to one embodiment, a semiconductor memory device comprises: a first conductor that extends in a first direction; a second conductor that extends in a second direction; a first memory cell connected between the first conductor and the second conductor and including a phase change element; and a control circuit. The control circuit is configured to apply a first voltage across the first memory cell via the first conductor and the second conductor during a first period of time of a write operation targeted to the first memory cell, and apply a second voltage across the first memory cell via the first conductor and the second conductor during a second period of time of the write operation after the first period. The first voltage being an overshoot voltage having a magnitude greater than the second voltage. The second voltage being a preset voltage for the write operation having a magnitude sufficient to place the phase change element in a molten state during the second period of time.

Hereinafter, a semiconductor memory device related to an embodiment will be described in detail with reference to the accompanying drawings. The present disclosure is not limited to the embodiment.

Example Embodiment

A semiconductor memory device according to a first embodiment will be described. The semiconductor memory device includes a nonvolatile memory having a plurality of memory cells. Each memory cell includes a phase change element. The phase change element can set two different phase states of a phase change material for memory information (data) storage. For example, a chalcogenide-based material (Ge, S, Te) can be used as the phase change material.

In a case where information stored in the memory cell is rewritten, the semiconductor memory device applies a voltage equal to or higher than a threshold value to the memory cell such that a snapback (a rapid resistance decrease) phenomenon occurs in the phase change element. When the snapback phenomenon occurs, a large cell current flows through the phase change element as a reset current, and the phase change element enters a molten state due to Joule heating. Thereafter, information is stored in the memory cell by setting the memory cell to a high resistance state (also referred to as a reset state) or a low resistance state (also referred to as set state) according to voltage level applied across the ends of the phase change element and the speed of the change in applied voltage levels. For example, if the voltage applied across the memory cell is suddenly lowered, the phase change element will be rapidly cooled from the molten state and will thus be solidified in a low crystallinity state (for example, a substantially amorphous state), which corresponds to the high resistance state (reset state), and it can be considered that a “0” (digital data value) is stored in the memory cell. However, if the voltage applied to the memory cell is gradually lowered, the phase change element will be gradually cooled from the molten state and will thus be solidified in a high crystallinity state (for example, substantially crystalline state), which corresponds to the low resistance state (set state), and it can be considered that a “1” (digital data value) is stored in the memory cell. A threshold voltage value of the memory cell in the high resistance state is higher than a threshold voltage value of the memory cell in the low resistance state.

A voltage $V_1$, which is set such that $V_1 \times 1/2$ (one-half $V_1$) is lower than a design value of the threshold voltage value of the memory cell in the low resistance state, can be set in advance as the voltage to be applied across the memory cell at the time of rewriting.

When the memory cell is read, a read voltage ($V_r$) at a level between the threshold voltage value in a low resistance state ($V_{thL}$) and the threshold voltage value in the high resistance state ($V_{thH}$) is applied to a memory cell. If the memory cell is in the low resistance state, the phase change element causes a snapback phenomenon to occur, and thereby, a large cell current flows. If the memory cell is in the high resistance state, the phase change element does not cause the snapback phenomenon to occur, and thereby, a small cell current flows or the cell current hardly flows at all. Thereby, by detecting the level of the cell current, the information stored in the memory cell can be detected "0" or "1".

The phase change element may be formed of, for example, a chalcogenide material, but chalcogenides are semiconductor materials having a narrow band gap, and resistance of these materials tends to decrease as temperature increases. This tendency is more pronounced in the amorphous state than in the crystalline state. Accordingly, to improve a usable ambient temperature range of a semiconductor memory device, it is desirable to secure a wide read margin, which is the voltage difference between the threshold voltage value in a low resistance state ($V_{thL}$) and the threshold voltage value in the high resistance state ($V_{thH}$).

Increasing the threshold voltage value of the cell in the high resistance state is one measure for securing a wider read margin. However, if the threshold voltage value in the high resistance state ($V_{thHS}$) is set to be higher than the preset voltage $V_1$, then even when the voltage $V_1$ is applied to the memory cell, the snapback phenomenon will not occur, and thus, there is a possibility it will be hard to rewrite information. In addition, in order to configure a semiconductor memory device at a low cost, it is desirable that existing controllers and control methods can be utilized, that is, for memory cell to be controllable/operable without substantially changing the level of the preset voltage $V_1$.

Another measure for securing a wider read margin is to lower the threshold voltage value of the low resistance state ($V_{thL}$). With this measure, a memory cell can be controlled without substantially changing the level of the preset voltage $V_1$, but if the threshold value in the low resistance state ($V_{thL}$) is set to be lower than one-half of the preset voltage $V_1$, a snapback phenomenon may occur even in unselected memory cells in the memory cell array that are not intended to be rewritten during a particular rewrite operation, and, in such cases, erroneous information may be stored in these unselected memory cells. That is, there is a possibility that inappropriate information is written into unselected memory cells of the array.

Therefore, in the semiconductor memory device according to the embodiment, the threshold values of each memory cell in the high resistance state is set to be higher than the preset voltage $V_1$, but the preset voltage $V_1$ is applied after a voltage higher than the preset voltage $V_1$ has been transiently applied to the memory cell during rewriting, and thereby, a wider read margin can be secured without causing improper information to be written into other memory cells.

Specifically, the semiconductor memory device of an example is a cross-point type memory device and includes a plurality of word lines and a plurality of bit lines. A memory cell is disposed at the intersection between a word line and a bit line. The semiconductor memory device is designed such that the threshold voltage value of each memory cell in the high resistance state ($V_{thH}$) is higher than the preset voltage $V_1$. Furthermore, in order to temporarily apply a voltage exceeding the threshold voltage value in the high resistance state ($V_{thH}$) to a selected memory cell being programmed in a rewriting operation, the program voltage applied to a selected word line, which is connected to the selected memory cell, is temporarily overshot (higher than $V_{thH}$). At this time, a voltage on an unselected bit line(s) is also overshot temporarily such that a half-selected memory cell (connected to a selected word line or a selected bit line but not both) is not snap-backed. Thereby, it is possible to reliably program the selected memory cell while avoiding is erroneous programming of unselected memory cells.

More specifically, a semiconductor memory device 200 can be configured as illustrated in FIG. 1. The semiconductor memory device 200 is communicably connected to a host 300 and functions as an external storage medium for the host 300. The semiconductor memory device 200 includes a nonvolatile memory 100 and a controller 210. The controller 210 controls the nonvolatile memory 100 in response to a request from the host 300 or, in some instances, autonomously.

The controller 210 includes a control unit 211, a host interface (I/F) 212, a memory interface (I/F) 213, an error correction (ECC) processing unit 214, a buffer memory 215, and a bus 216. The control unit 211, the host interface (I/F) 212, the memory interface (I/F) 213, the error correction (ECC) processing unit 214, and the buffer memory 215 are communicably connected to each other via the bus 216. The control unit 211 is, for example, a central processing unit (CPU), and comprehensively controls each unit in the controller 210. The host I/F 212 mediates communication with the host 300. The memory I/F 213 mediates transfer of data and instructions to and from the nonvolatile memory 100. The ECC processing unit 214 performs error correction processing of data read from the nonvolatile memory 100. The buffer memory 215 temporarily stores (buffers) data and instructions transferred to and from the nonvolatile memory 100 and can also be used as a work area by the control unit 211.

Figure 2:
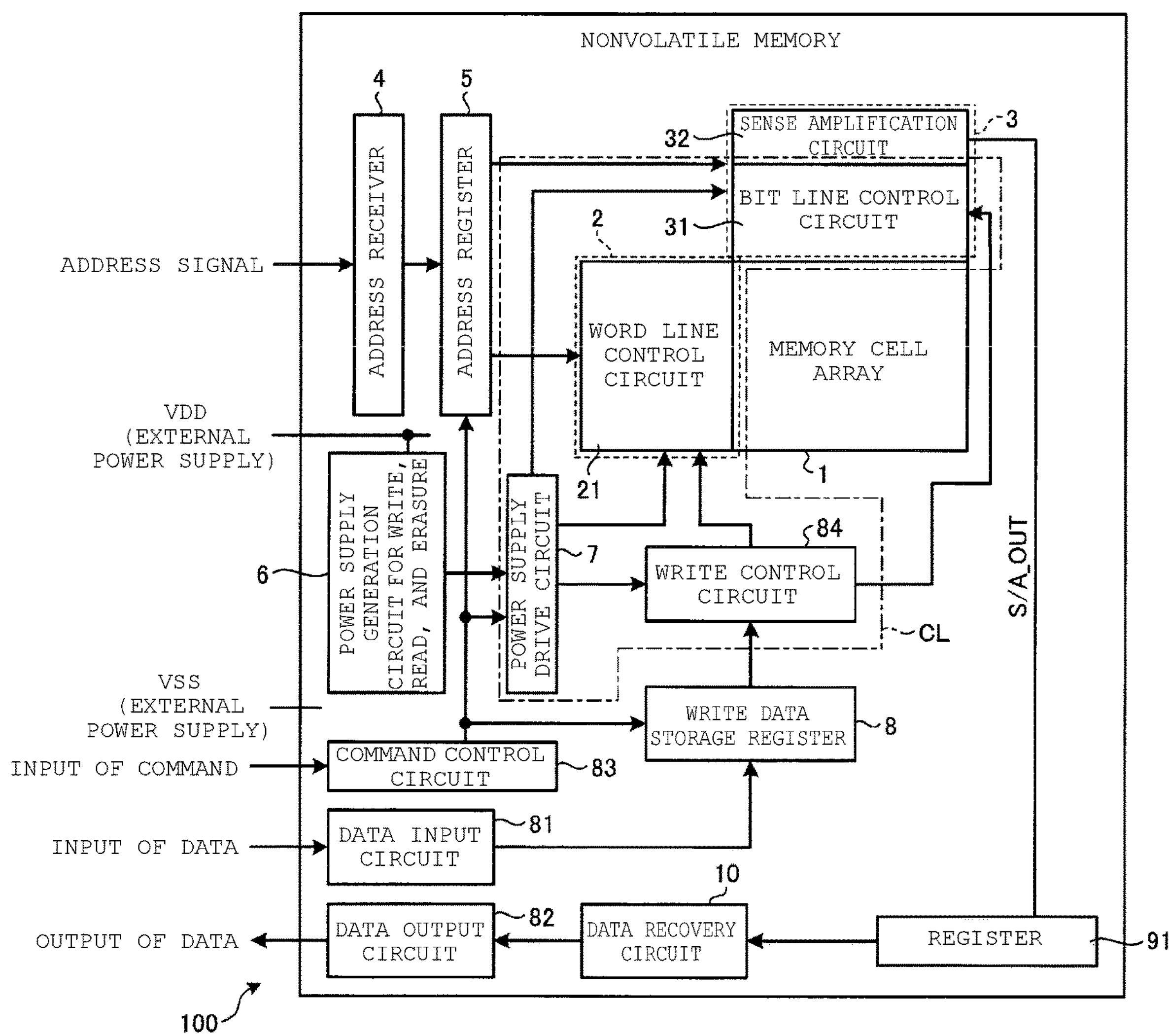
FIG. 2 is a diagram illustrating a nonvolatile memory according to an embodiment.
Figure 3:
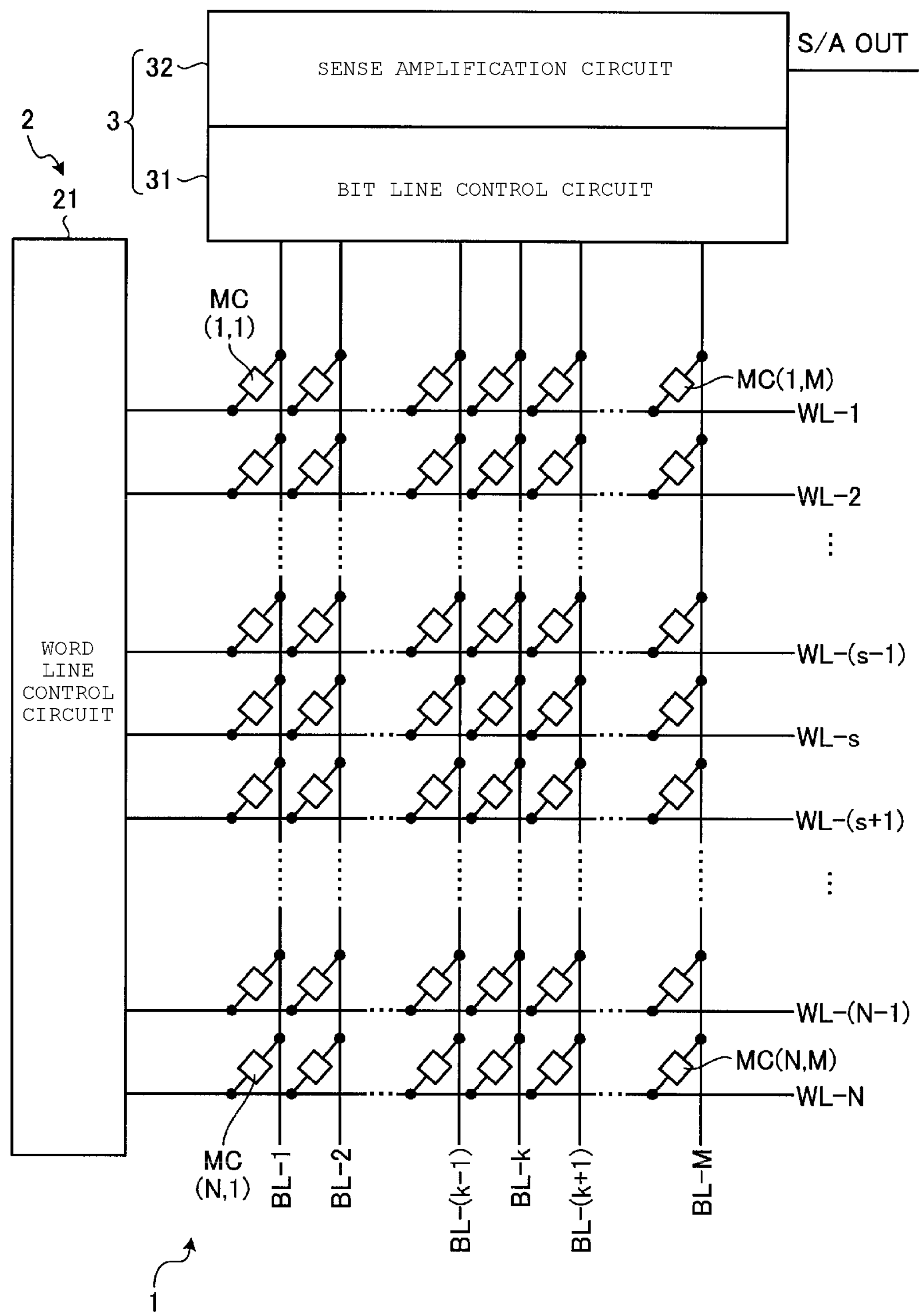
FIG. 3 is a diagram illustrating a memory cell array according to an embodiment.
Figure 4:
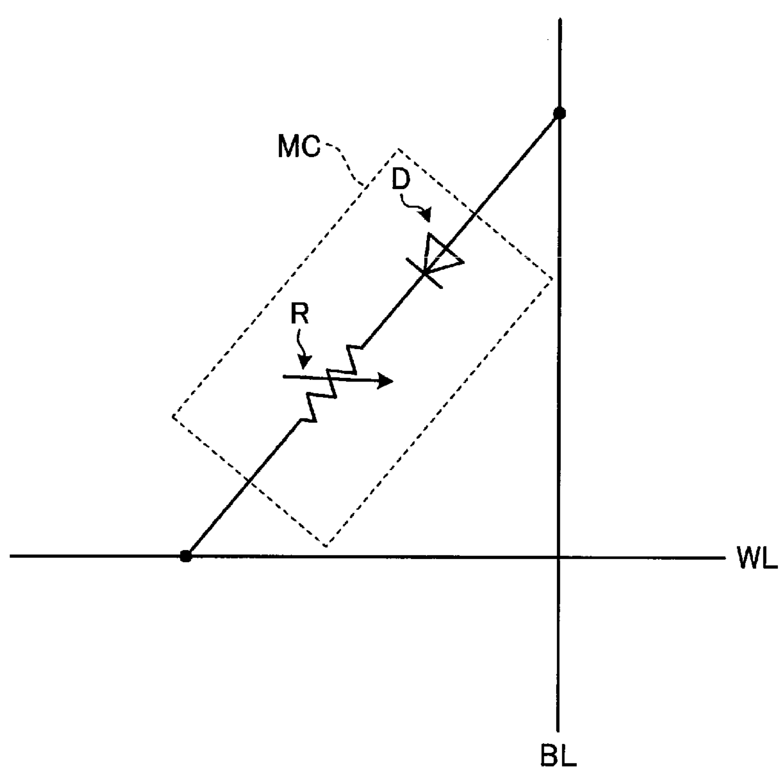
FIG. 4 is a diagram illustrating a memory cell according to an embodiment.

FIG. 2 is a diagram illustrating a configuration of the nonvolatile memory 100. FIG. 3 is a diagram illustrating a configuration of a memory cell array 1. FIG. 4 is a circuit diagram illustrating a configuration of a memory cell MC.

The nonvolatile memory 100 is, for example, a resistance random access memory (ReRAM) including a cross point type memory cell array 1. The nonvolatile memory 100 includes the memory cell array 1, word lines WL-1 to WL-N, a row control circuit 2, bit lines BL-1 to BL-M, a column control circuit 3, an address receiver 4, an address register 5, a power supply generation circuit 6 for write, read, and erasure, a power supply drive circuit 7, a command control circuit 83, a write data storage register 8, a write control circuit 84, a data recovery circuit 10, a data input circuit 81, and a data output circuit 82. As used in this notation, N is an integer larger than or equal to 4, and M is an integer larger than or equal to 2.

The memory cells MC(1,1) to MC(N,M) are arranged in the memory cell array 1, as illustrated in FIG. 3. For example, the memory cells MC(1,1) to MC(N,M) are two-dimensionally arranged at intersections between the N word lines (WL-1 to WL-N) and the M bit lines (BL-1 to BL-M). A three-dimensional arrangement of memory cells MC may be achieved by stacking the two-dimensional arrangement of the memory cells MC (as a memory layer), in the memory cell array 1.

As illustrated in FIG. 4, a rectification element D and a phase change element R are connected in series to each other within the memory cell MC at the intersection between a word line WL and a bit line BL. The rectification element D is, for example, a diode having a cathode thereof connected to the phase change element R, and an anode thereof connected to the bit line BL. One end of the phase change element R is connected to the word line WL and the other end thereof is connected to the cathode of the rectification element D.

The phase change element R is an element that transitions between two resistance value states according to a difference in crystallinity of a material in the phase change element R. For example, the phase change element R switches between a low resistance state and a high resistance state. In these two resistance value states, the low resistance state corresponds to a high crystallinity state and the high resistance state corresponds to a low crystallinity state. For simplicity, the high crystallinity state may be referred to as a crystalline state, and the low crystallinity state may be referred to as an amorphous state. However, it is not required for the low resistance state to be completely crystalline nor for the high resistance state to be completely amorphous. The resistance states of the phase change element may be based on relative differences in crystallinity between these states rather than any particular level of crystallinity or amorphousness. Information is stored in the memory cell MC by changing a memory cell R to the high resistance state (reset state) or the low resistance state (set state).

Figure 5:
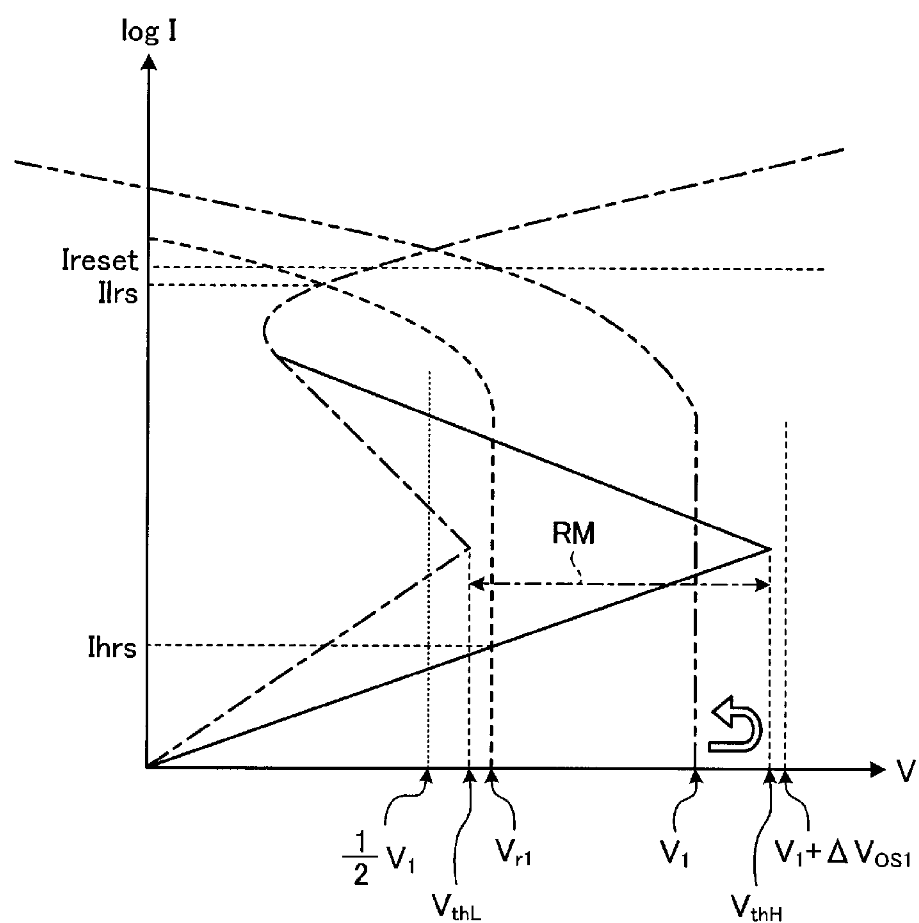
FIG. 5 is a diagram illustrating voltage-current characteristics of a memory cell according to an embodiment.

For example, in a case where the memory cell MC is in a low resistance state, the memory cell MC has a current-voltage characteristics depicted in FIG. 5 with the alternating long-short dashed line. By applying a voltage $V_1$ to the memory cell MC, a voltage higher than or equal to a threshold value $V_{thL}$ is applied to the memory cell MC, and a snapback phenomenon can occur.

In a case where the memory cell MC is in the high resistance state, the memory cell MC has a voltage-current characteristics depicted in FIG. 5 with the solid line. Accordingly, when the voltage $V_1$ is applied to the memory cell MC, a voltage equal to or higher than a threshold value $V_{thH}$ is still not applied to the memory cell MC, and thus, a snapback phenomenon will not occur substantially. Accordingly, in a case where the information stored in the memory cell MC is being rewritten, the voltage applied to the memory cell MC can be temporarily overshot to become the voltage $V_1+\Delta V_{OS1}$ as denoted by a dashed line in FIG. 5. At the voltage $V_1+\Delta V_{OS1}$, the voltage corresponding to the amount of overshoot is represented by $\Delta V_{OS1}$ (which is a voltage amount>0 V). Thereby, a voltage greater than the threshold value $V_{thH}$ is applied to the memory cell MC, and, thereby, the snapback phenomenon can occur.

In addition, in a case where the information stored in the memory cell MC is being read, a read voltage ($V_{r1}$) having a level somewhere between the threshold value $V_{thL}$ and the threshold value $V_{thH}$ is applied to the memory cell MC. If the memory cell MC is in the low resistance state, the phase change element causes the snapback phenomenon to occur, and a large cell current (current level Ilrs) thus flows. If the memory cell MC is in the high resistance state, the phase change element R does not cause the snapback phenomenon to occur, and a small cell current (current level Ihrs) thus flows or the cell current may hardly flow at all. Thereby, it is possible to detect whether the information stored in the memory cell MC being read is "0" or "1" by detecting the level of the cell current that flows. That is, a voltage difference between the threshold value $V_{thL}$ (low resistance state) and the threshold value $V_{thH}$ (high resistance state) becomes a read margin RM corresponding to a range in which the read voltage (Vr) can be set.

FIG. 4 illustrates a configuration in which the direction from the bit line BL toward the word line WL through the memory cell MC is a forward direction of the rectification element D, but a configuration in which the direction from the bit line BL toward the word line WL through the memory cell MC is a reverse direction of the rectification element D may also be used in some embodiments. Also, within the memory cells MC, the positions of the rectification element D and the phase change element R may be exchanged (e.g., rectification element D directly connected to the word line WL rather than the bit line BL).

The address receiver 4 illustrated in FIG. 2 stores an address signal (which is supplied from the outside) in the address register 5. The command control circuit 83 receives a command (supplied from the outside) and outputs a command corresponding to the received command to each circuit. For example, the command control circuit 83 outputs a command for controlling an operation voltage, an operation timing, or the like during the write, read, or erasing operations. The address register 5 sends the address signal to the row control circuit 2 and the column control circuit 3 according to the command from the command control circuit 83.

The data input circuit 81 temporarily stores write data (the data to be written to the memory cell array 1), which is received from the outside, in the write data storage register 8. The write data storage register 8 sends the data to the write control circuit 84 according to a command from the command control circuit 83. The write control circuit 84 controls the voltages transferred from the power supply drive circuit 7.

The data output circuit 82 is connected to an external host via an external I/O line and performs output of read data (data that has been read from the memory cell array 1), notifications of the completion of a write operation, and notifications of completion of an erasure operation.

The power supply generation circuit 6 generates power supply voltages for write, read, and erasure operations, and supplies these voltages to the power supply drive circuit 7.

The power supply drive circuit 7 supplies the power supply voltages for write, read, and erasure operations to the row control circuit 2 and the column control circuit 3 in response to a command from the command control circuit 83.

The N word lines (WL-1 to WL-N) illustrated in FIG. 3 extend in a row direction (left-right page direction in FIG. 3) and are between adjacent rows of memory cells MC.).

The row control circuit 2 illustrated in FIG. 2 is provided at a position adjacent to the memory cell array 1 in the lengthwise (row) direction of the word lines WL. The row control circuit 2 is connected to the N word lines WL-1 to WL-N. The row control circuit 2 includes the word line control circuit 21. The word line control circuit 21 receives an address signal from the address register 5 and drives the word lines WL according to the address signal.

Figure 6:
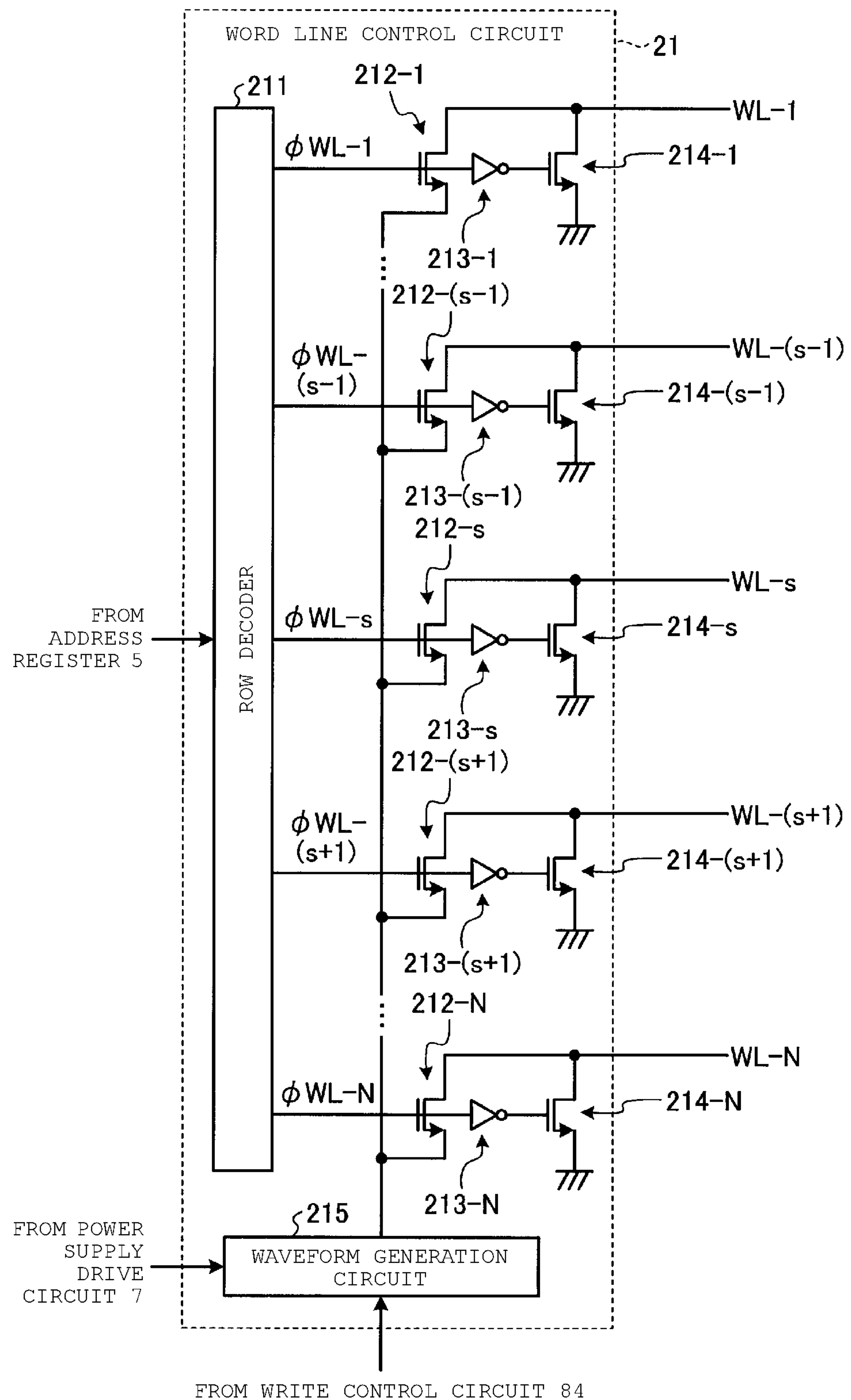
FIG. 6 is a diagram illustrating a word line control circuit according to an embodiment.

The word line control circuit 21 is configured, for example, as illustrated in FIG. 6. FIG. 6 is a circuit illustrating a possible configuration of the word line control circuit 21. The word line control circuit 21 includes a row decoder 211, N selection switches 212-1 to 212-N, N inverters 213-1 to 213-N, N non-selection switches 214-1 to 214-N, and a waveform generation circuit 215. The N selection switches 212-1 to 212-N, the N inverters 213-1 to 213-N, and the N non-selection switches 214-1 to 214-N corresponding to the N word lines WL-1 to WL-N.

Each of the selection switches 212-1 to 212-N is, for example, an NMOS transistor, a gate thereof is connected to the row decoder 211, a source thereof is connected to the waveform generation circuit 215, and a drain thereof is connected to the corresponding word line WL. Each of the non-selection switches 214-1 to 214-N is, for example, an NMOS transistor, a gate thereof is connected to the corresponding inverter 213, a source thereof is connected to a ground potential, and a drain thereof is connected to the corresponding word line WL. Input nodes of the inverters 213-1 to 213-N are connected to the row decoder 211, and each of output nodes thereof is connected to a control terminal (also referred to as a gate in some contexts) of the corresponding non-selection switch 214. The waveform generation circuit 215 can generate and output a voltage (see FIG. 8) including an overshoot amount. For example, the waveform generation circuit 215 may simply adding circuitry for generating and adding the overshoot component to an existing voltage waveform.

The row decoder 211 sets a control signal corresponding to a selected word line among N control signals ϕWL-1 to ϕWL-N to an active level (for example, H level) and sets a control signal corresponding to an unselected word line to an inactive level (for example, L level), in response to the address signal received from the address register 5. According to this, the selection switch 212 corresponding to the selected word line WL among the N selection switches 212-1 to 212-N is turned on to connect the waveform generation circuit 215 to the selected word line WL, and the non-selection switch 214 corresponding to the unselected word line WL is turned on to connect the ground potential to the unselected word line WL. Thereby, a voltage including the overshoot amount generated by the waveform generation circuit 215 can be selectively supplied to the selected word line WL.

The M bit lines (BL-1 to BL-M) illustrated in FIG. 3 extend in a column direction (up-down page direction in FIG. 3) between adjacent columns of memory cells MC.

The column control circuit 3, illustrated in FIG. 2, is provided at a position adjacent to the memory cell array 1 in the lengthwise (column) direction of the bit lines BL. The column control circuit 3 is connected to M bit lines BL-1 to BL-M. The column control circuit 3 includes a bit line control circuit 31 and a sense amplification circuit 32. The bit line control circuit 31 receives an address signal from the address register 5 and drives the bit line BL according to the address signal.

Figure 7:
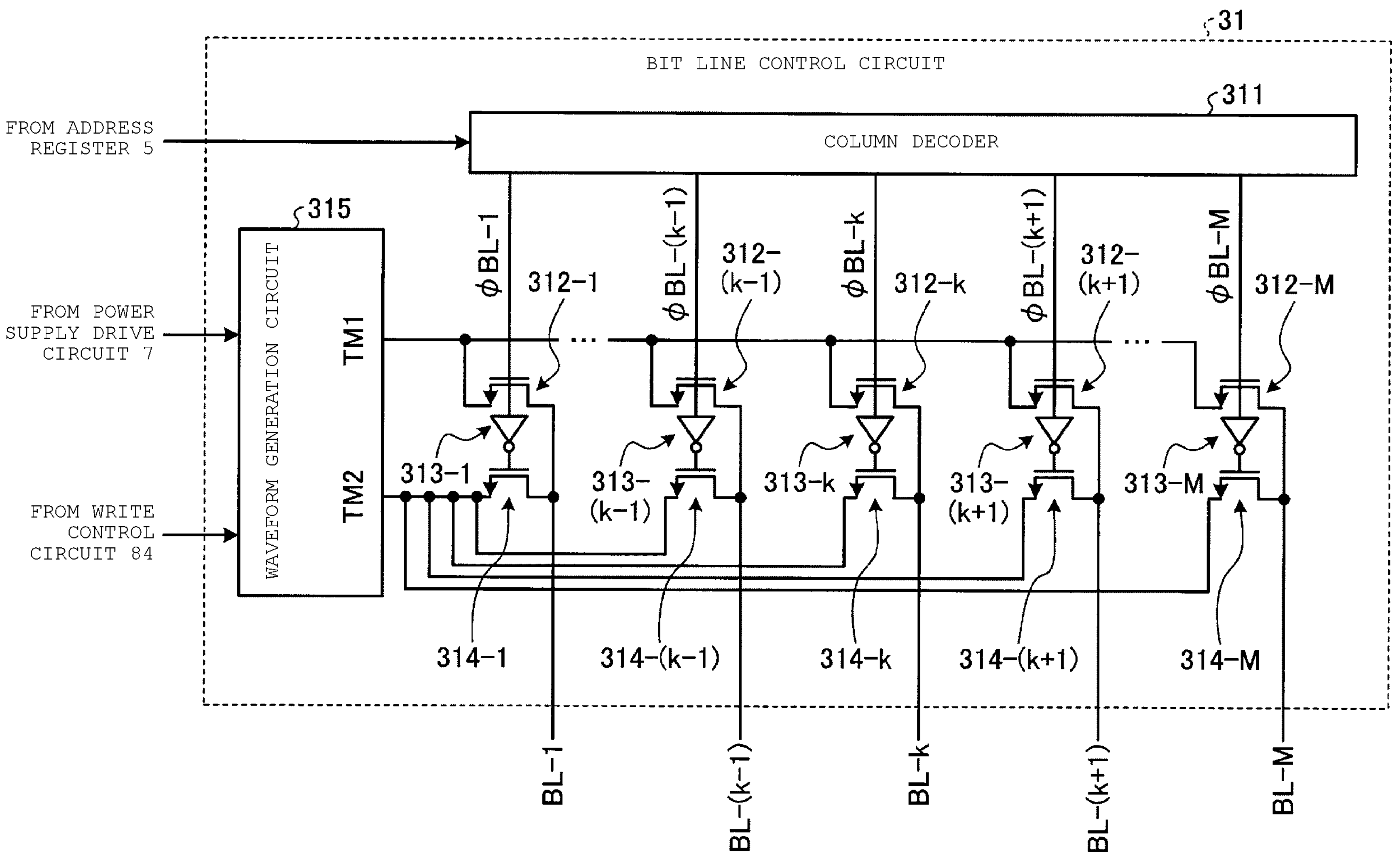
FIG. 7 is a diagram illustrating a bit line control circuit according to an embodiment.

The bit line control circuit 31 is configured, for example, as illustrated in FIG. 7. FIG. 7 is a circuit illustrating a configuration of the bit line control circuit 31. The bit line control circuit 31 includes a column decoder 311, M selection switches 312-1 to 312-M, M inverters 313-1 to 313-M, M non-selection switches 314-1 to 314-M, and a waveform generation circuit 315. The M selection switches 312-1 to 312-M, the M inverters 313-1 to 313-M, and the M non-selection switches 314-1 to 314-M correspond to the M bit lines BL-1 to BL-M.

Each of the selection switches 312-1 to 312-M is, for example, an NMOS transistor, a gate thereof is connected to the column decoder 311, a source thereof is connected to the waveform generation circuit 315, and a drain thereof is connected to a corresponding bit line BL. Each of the non-selection switches 314-1 to 314-M is, for example, an NMOS transistor, a gate thereof is connected to a corresponding inverter 313, a source thereof is connected to the ground potential, and a drain thereof is connected to a corresponding bit line BL. Each input node of the inverters 313-1 to 313-M is connected to the column decoder 311, and each output node is connected to a control terminal (also referred to as a gate in some contexts) of a corresponding non-selection switch 314. The waveform generation circuit 315 can generate a voltage (see FIG. 8) that does not include an overshoot for output the voltage from a terminal TM1 and generate a voltage including the overshoot (see FIG. 8) for output from a terminal TM2. For example, the waveform generation circuit 315 can be configured by adding a circuit that generates overshoot components for adding to a standard voltage waveform and outputs these overshoot component waveforms from the terminal TM2 to a circuit that generates a standard voltage waveform and outputs this waveform from the terminal TM1.

The column decoder 311 sets a control signal corresponding to a selected bit line among the M control signals ϕBL-1 to ϕBL-M to an active level (for example, H level) and sets a control signal corresponding to an unselected bit line to an inactive level (for example, L level), in response to an address signal received from the address register 5. According to this, the selection switch 312 corresponding to the selected bit line BL among the M selection switches 312-1 to 312-M is turned on to connect the terminal TM1 of the waveform generation circuit 315 to the selected bit line BL, and the non-selection switch 314 corresponding to the unselected bit line BL is turned on to connect the terminal TM2 of the waveform generation circuit 315 to the unselected bit line WL. Thereby, the voltage not including an overshoot as generated by the waveform generation circuit 315 can be selectively supplied to the selected bit line BL, and a voltage including the overshoot generated by the waveform generation circuit 315 is supplied to the unselected bit line BL.

The bit line control circuit 31 illustrated in FIGS. 2 and 3, for example, selects the bit line BL-k, and writes data to and reads data from the memory cell selected from among the memory cells MC(1,k) to MC(N,k) of a kth column. In addition, the bit line control circuit 31 amplifies the read data and outputs the amplified data to the register 91, via the sense amplification circuit 32. The sense amplification circuit 32 outputs a detection result S/A_OUT to the register 91.

A configuration including the power supply drive circuit 7, the write control circuit 84, the word line control circuit 21, and the bit line control circuit 31 can be regarded as a control circuit CL for controlling voltages of the word lines WL-1 to WL-N and voltages of the bit lines BL-1 to BL-M when information is rewritten to the memory cells MC(1,k) to MC(N,M).

Figure 8:
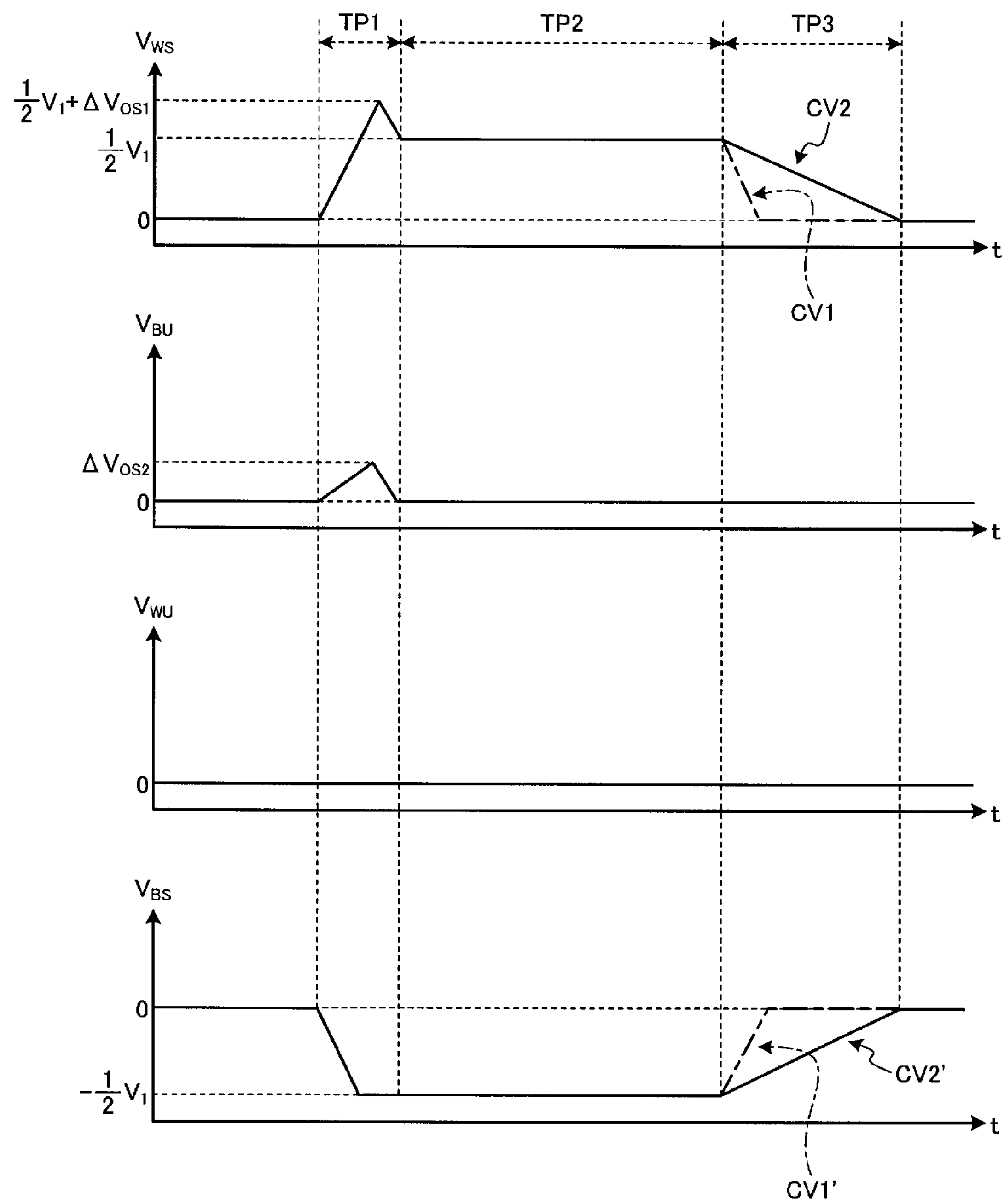
FIG. 8 is a waveform diagram illustrating aspects of an operation of rewriting information to the nonvolatile memory according to an embodiment.

Next, an operation of rewriting information to the nonvolatile memory 100 will be described with reference to FIG. 8. FIG. 8 is a waveform diagram illustrating the operation of rewriting the information to the nonvolatile memory 100.

FIG. 8 depicts a case in which the control circuit CL has the voltage $V_1$ set as a particular value, a threshold value of each memory cell MC in a high resistance state is set to be higher than the voltage $V_1$, and a voltage in a high resistance state (reset state) is stored in the selected memory cell MC to which the control circuit CL is rewriting information.

During a period TP1, the control circuit CL applies a voltage higher than the voltage $V_1$ to the selected memory cell MC via the selected word line WL and the selected bit line BL.

Specifically, the control circuit CL sets a potential $V_{WS}$ of the selected word line WL to a potential (for example, $\frac{1}{2}\times V_1+\Delta V_{OS1}$, $V_1>0$, $\Delta V_{OS1}>0$) higher than a selection potential during the period TP1. The control circuit CL controls a waveform of the potential $V_{WS}$ of the selected word line WL to provide a waveform increasing from a reference potential (ground potential) to a predetermined potential ($\frac{1}{2}\times V_1+\Delta V_{OS1}$) above (overshooting) the selection potential ($\frac{1}{2}\times V_1$), thereby, setting the potential $V_{WS}$ of the selected word line WL to a potential higher than the selection potential. At the same time, the control circuit CL sets the potential $V_{BS}$ of the selected bit line BL to the selection potential (for example, $-\frac{1}{2}\times V_1$).

Figure 9A:
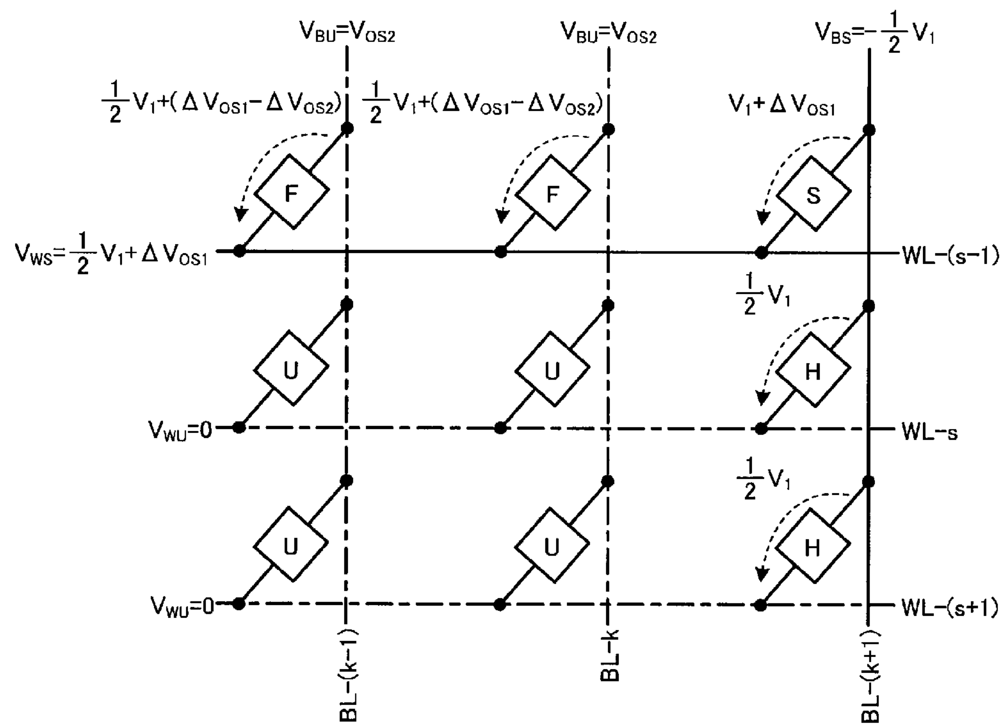
FIGS. 9A and 9B are diagrams illustrating voltages applied to a memory cell according to an embodiment.

Thereby, a voltage of $\frac{1}{2}\times V_1+\Delta V_{OS1}-(-\frac{1}{2}\times V_1)=V_1+\Delta V_{OS1}$ is applied across the selected memory cell MC(s−1, k+1) denoted by "S" in FIG. 9A. FIG. 9A is a diagram illustrating the voltage applied to each memory cell MC during the period TP1. Considering that $\Delta V_{OS1}>0$, a voltage across the selected memory cell "S" becomes $V_1+\Delta V_{OS1}>V_1$, and a voltage higher than the voltage $V_1$ is applied to across the selected memory cell "S".

At this time, although the memory cells MC(s−1, k−1) and MC(s−1, k) denoted by "F" in FIG. 9A are unselected memory cells MC, and are referred to as a half-selected memory cell "F", since the selection potential $V_{WS}=\frac{1}{2}\times V_1+\Delta V_{OS1}$ is supplied to one end via the selected word line WL-(s−1) and a non-selection potential $V_{BU}$ is supplied to the other end via the unselected bit lines BL-(k−1) and BL-k. In contrast to this, if $V_{BU}=0$ (ground potential), then $V_{WS}-V_{BU}=\frac{1}{2}\times V_1+\Delta V_{OS1}$ (and thus $V_{WS}-V_{BU}>\frac{1}{2}\times V_1$) is applied across the half-selected memory cell "F", a snapback phenomenon might occur despite these cells being nominally unselected, and there is a possibility that erroneous information will be stored in these cells. That is, there is a possibility that inappropriate information will be rewritten in the memory array 1.

Accordingly, the control circuit CL sets the potential $V_{BU}$ of the unselected bit line BL to a potential (for example, $\Delta V_{OS2}>0$) higher than the non-selection potential (ground potential) during the period TP1. As illustrated in FIG. 8, the control circuit CL controls a waveform of the potential $V_{BS}$ of the unselected bit line BL to increase from a non-selection potential (ground potential) to a predetermined potential ($\Delta V_{OS2}$) thereby, setting the potential $V_{BS}$ of the unselected bit line BL to a potential higher than the non-selection potential. At the same time, the control circuit CL sets the potential $V_{WU}$ of the unselected word line WL to the non-selection potential (ground potential).

The amount of overshoot in $V_{BU}$ above the reference potential is $\Delta V_{OS2}\geq\Delta_{VOS1}$ to be equal to or more than the amount of overshoot ($\Delta_{VOS1}$) in the potential $V_{WS}$.

Figure 9B:
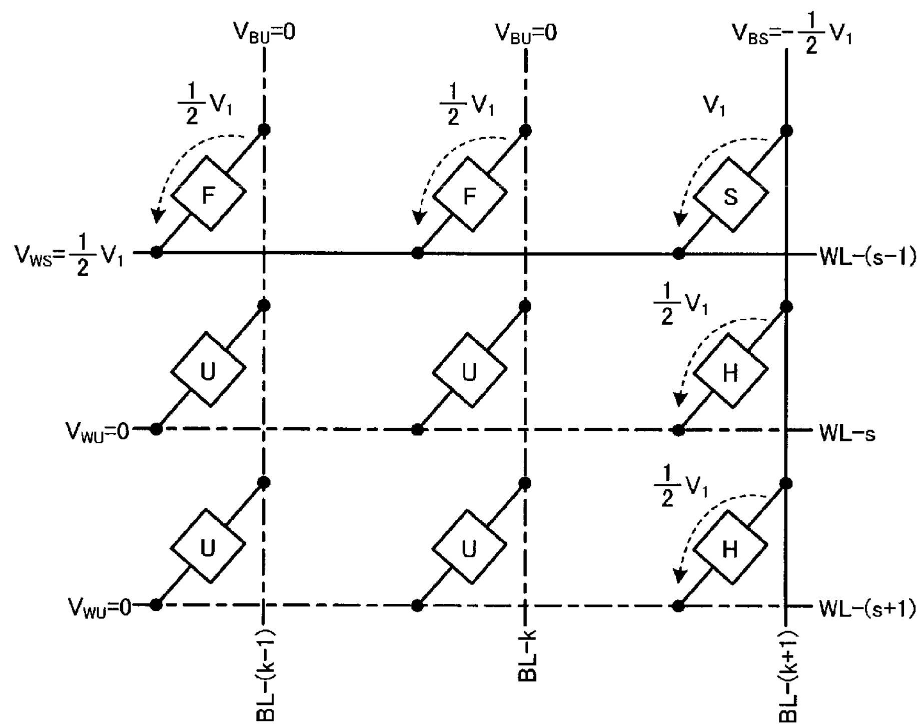

Thereby, a voltage of $V_{WS}-V_{BU}=\frac{1}{2}\times V_1\times\Delta V_{OS1}-\Delta V_{OS2}$ (and thus $V_{WS}-V_{BU}\leq(\frac{1}{2}\times V_1)$) is applied across the half-selected memory cells "F" illustrated in FIGS. 9A and 9B, and thereby, the snapback phenomenon can be prevented from occurring in these cells.

The memory cells MC(s,k+1) and MC(s+1,k+1) denoted by "H" in FIG. 9A are unselected memory cells MC, and are referred to as a half-selected memory cell "H". The non-selection potential $V_{WU}=0$ (ground potential) is supplied to one end these cells via the unselected word lines WL-s and WL-(s+1) and the selection potential $V_{BS}=-\frac{1}{2}\times V_1$ is supplied to the other end of these cells via the selected bit line BL-(k+1). Since a voltage of $V_{WU}-V_{BS}=+\frac{1}{2}\times V_1$ is applied to across the half-selected memory cells "H", no snapback phenomenon occurs.

In addition, the memory cells MC(k−1,s), MC(k,s), MC(k−1,s+1), and MC(k,s+1) denoted by "U" in FIG. 9A are unselected memory cell MC, and are referred to as unselected memory cells "U". A non-selection potential $V_{WU}=0$ (ground potential) is supplied to one end of these cells via the unselected word lines WL-s and WL-(s+1) and a non-selection potential $V_{BS}=\Delta V_{OS2}$ is supplied to the other end of these cells via the unselected bit lines BL-(k−1) and BL-k. Since a voltage $V_{WU}-V_{BU}=-\Delta V_{OS2}$ is applied across the unselected memory cell "U", no snapback phenomenon occurs.

During a period TP2 illustrated in FIG. 8, the control circuit CL applies the voltage $V_1$ across the selected memory cell MC via the selected word line WL and the selected bit line BL. The period TP2 is a period after the period TP1.

Specifically, during the period TP2, the control circuit CL sets the potential $V_{WS}$ to the selection potential ($\frac{1}{2}\times V_1$) and sets the potential $V_{BS}$ to the selection potential ($-\frac{1}{2}\times V_1$).

Thereby, a voltage of $+\frac{1}{2}\times V_1-(-\frac{1}{2}\times V_1)=V_1$ is applied across the selected memory cell "S" illustrated in FIG. 9B, but information of the selected memory cell "S" is in a rewritable state because the snapback phenomenon has occurred. FIG. 9B is a diagram illustrating voltages applied to various memory cells MC during the period TP2.

A voltage of $+\frac{1}{2}\times V_1-0=\frac{1}{2}\times V_1$ is applied across the half-selected memory cell "F" illustrated in FIG. 9B, a voltage of $0-(-\frac{1}{2}\times V_1)=\frac{1}{2}\times V_1$ is applied across the half-selected memory cell "H", and a voltage of 0 (0−0=0) is applied across the unselected memory cell "U", and thereby, the snapback phenomenon does not occur in any of these respective memory cells.

During a period TP3, the control circuit CL operates to change the selected memory cell MC to one of the high resistance state (reset state) or the low resistance state (set state) by changing a magnitude a voltage applied across the phase change element R at some rate of change (speed).

Specifically, in a case where the controller 210 (see FIG. 1) intends that "0" be stored in the selected memory cell MC, the control circuit CL changes the potential $V_{WS}$ of the selected word line WL from the selection potential ($+\frac{1}{2}\times V_1$) to the non-selection potential (0) at a rate CV1 as denoted by a sloped dashed line in FIG. 8. The change rate CV1 results in a rate of voltage change (volt/time) at which the phase change element will be rapidly cooled from a molten state. At the same time, the control circuit CL also changes the potential $V_{BS}$ from the selection potential ($-\frac{1}{2}\times V_1$) to the non-selection potential (0) at the rate CV1' as denoted a sloped dashed line in FIG. 8. The change rate CV1' is a rate of voltage change similar to the change speed CV1, and results in a rate of voltage change at which the phase change element will be rapidly cooled from the molten state. Because the phase change element of the selected memory cell MC is rapidly cooled from the molten state and quickly solidified it will be in a low crystallinity state (for example, in an amorphous state), which corresponds to a high resistance state (reset state) at which "0" is stored in the memory cell MC.

When the controller 210 (see FIG. 1) requests that "1" be stored in the selected memory cell MC, the control circuit CL changes the potential $V_{WS}$ from the selection potential ($+\frac{1}{2}\times V_1$) to the non-selection potential (0) at the change rate CV2 as denoted by a solid line in FIG. 8. The change speed CV2 is a change rate slower (more gradual) than the change rate CV1, and results in a change rate at which the phase change element will be more gradually cooled from the molten state to a solid state. At the same time, the control circuit CL changes the potential $V_{BS}$ from the selection potential ($-\frac{1}{2}\times V_1$) to the non-selection potential (0) at a change rate CV2' as denoted by the solid line in FIG. 8. The change rate CV2' is slower than the change rate CV1', and is a change rate at which the phase change element will be gradually cooled from the molten state. Thereby, the phase change element in the selected memory cell MC will be gradually cooled from the molten state and thus be solidified in a high crystallinity state, which is a low resistance state (set state) by which "1" is stored in the memory cell MC.

As described above, the semiconductor memory device 200 has threshold values for each memory cell MC in the high resistance state that are higher than the preset voltage $V_1$, and applies this preset voltage $V_1$ to the memory cells MC during rewriting after applying a voltage that is higher than the voltage $V_1$ for some period of time, which may be brief. For example, the semiconductor memory device 200 temporarily overshoots the nominal selection potential for a selected word line (e.g., preset voltage $V_1$) to a potential higher somewhat higher than the nominal selection potential. After a brief overshoot period at this higher potential, the selected word line is maintained at the nominal selection potential until a rewriting step. According to this, the semiconductor memory device 200 also temporarily overshoots a nominal potential of the unselected bit line to a potential higher somewhat higher than the nominal non-selection potential. After the temporary overshooting, the unselected word line is returned to the nominal non-selection potential. Thereby, it is possible to rewrite appropriate information while still securing a wide read margin (see line RM in FIG. 5).

Instead of directly overshooting the potential of the selected word line WL by direct control of the voltage applied to the selected word line, the selected word line WL itself can be kept in a floating state a potential of a wire capacitively coupled to the selected word line WL can be varied, to thereby cause the potential of the selected word line WL to overshot.

Figure 10:
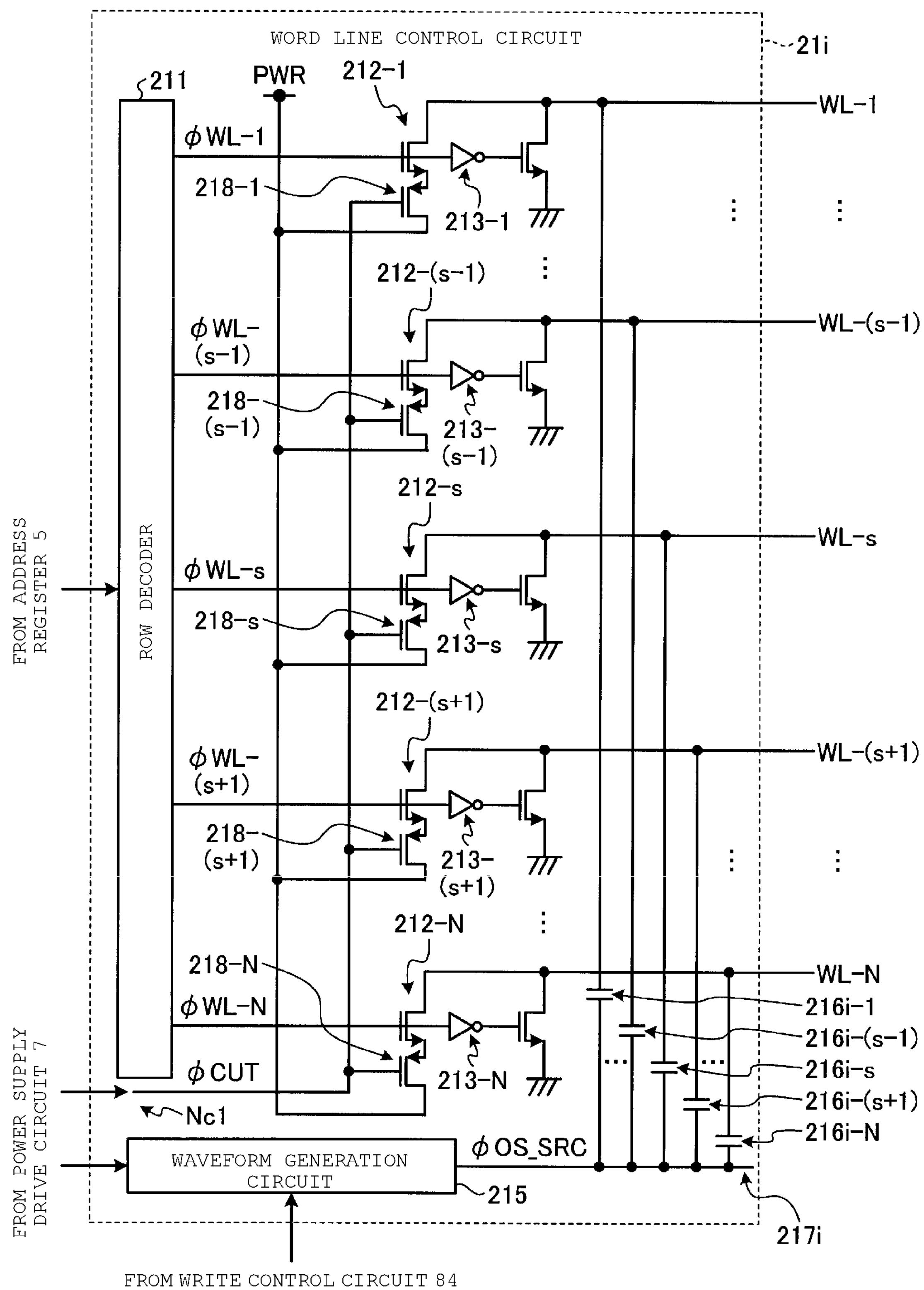
FIG. 10 is a diagram illustrating a word line control circuit according to a first modification example.

For example, a word line control circuit 21*i* may be configured as illustrated in FIG. 10. FIG. 10 is a diagram illustrating a configuration of the word line control circuit 21*i* according to a first modification example of the embodiment. The word line control circuit 21*i* includes capacitive elements 216*i*-1 to 216*i*-N, a drive line 217*i*, and disconnection switches 218-1 to 218-N. The capacitive elements 216*i*-1 to 216*i*-N are matched to the word lines WL-1 to WL-N. One end of the capacitive element 216*i*-1 is connected to the drive line 217*i*, and the other end thereof is connected to the corresponding word line WL-1. One end of the capacitive element 216*i*-N is connected to the drive line 217*i*, and the other end thereof is connected to the corresponding word line WL-N. The disconnection switches 218-1 to 218-N correspond to the word lines WL-1 to WL-N. Each of the disconnection switches 218-1 to 218-N is, for example, a PMOS transistor, and includes a gate connected to a control node Nc1, a source connected to a source of one of the selection switches 212-1 to 212-N, a drain connected to a power supply potential PWR. A disconnection control signal ϕCUT is supplied from the power supply drive circuit 7 to the control node Nc1.

Figure 11:
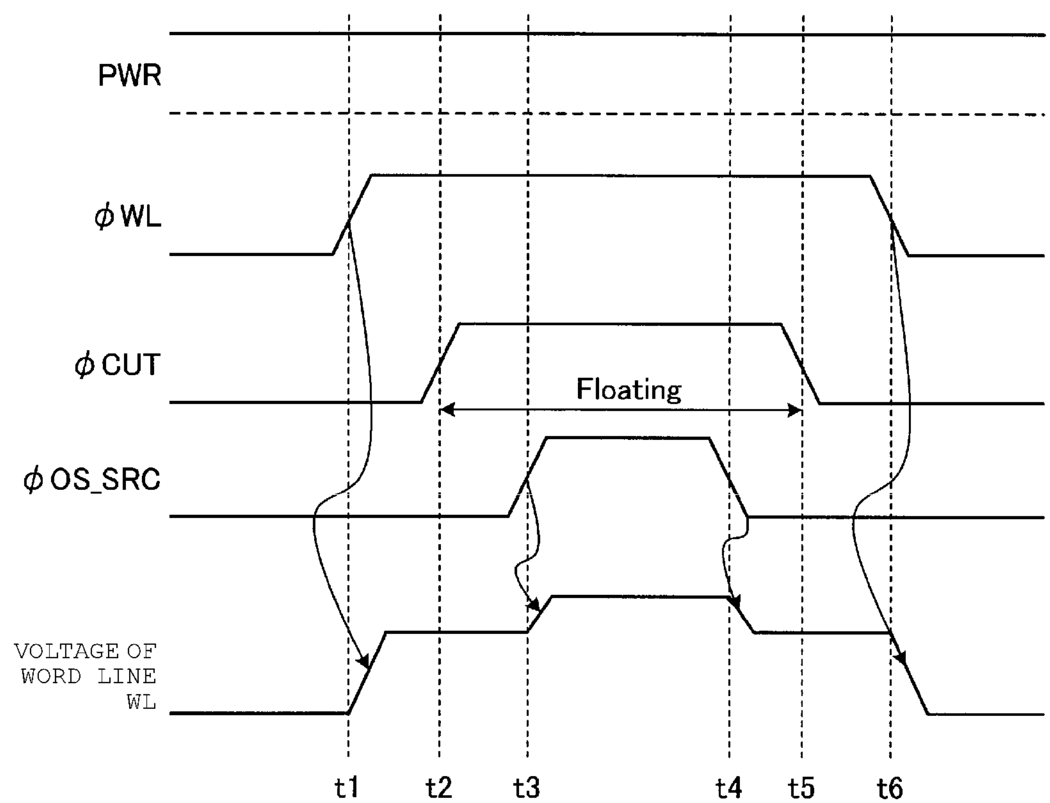
FIG. 11 is a waveform diagram illustrating aspects on an operation of a word line control circuit according to the first modification example.

The word line control circuit 21*i* can operate as illustrated in FIG. 11. FIG. 11 is a waveform diagram illustrating the operation of the word line control circuit 21*i* according to the first modification example of the embodiment.

At time t1, the row decoder 211 sets the control signal ϕWL corresponding to a selected word line among the N control signals ϕWL-1 to ϕWL-N (see FIG. 7) to an active level (for example, H level) and sets the control signal corresponding to an unselected word line to an inactive level (for example, L level) in response to an address signal received from the address register 5. According to this, the selection switch 212 corresponding to the selected word line WL among the N selection switches 212-1 to 212-N is turned on to connect the power supply potential PWR to the selected word line WL via the disconnection switch 218, and the non-selection switch 214 corresponding to the unselected word line WL is turned on to connect the ground potential to the unselected word line WL.

At time t2, as the disconnection control signal OUT changes from the inactive level (for example, L level) to the active level (for example, H level), the disconnection switch 218 is turned off to make the selected word line WL enter a floating state.

At time t3, a voltage ϕOS_SRC including the overshoot generated by the waveform generation circuit 215 is being selectively supplied to the selected word line WL via a drive line 217*i* and the capacitive element 216*i*.

At time t4, an overshoot of the voltage ϕOS_SRC from the waveform generation circuit 215 is being ended and the voltage ϕOS_SRC eventually goes to a level corresponding to the selection potential.

At time t5, as the disconnection control signal OUT returns from the active level (for example, H level) to the inactive level (for example, L level), the disconnection switch 218 is turned on to release the floating state of the selected word line WL, and the selected word line WL is connected to power supply potential PWR again.

At time t6, the row decoder 211 is being controlled to set the control signal ϕWL corresponding to the selected word line to the inactive level (for example, L level).

Figure 12:
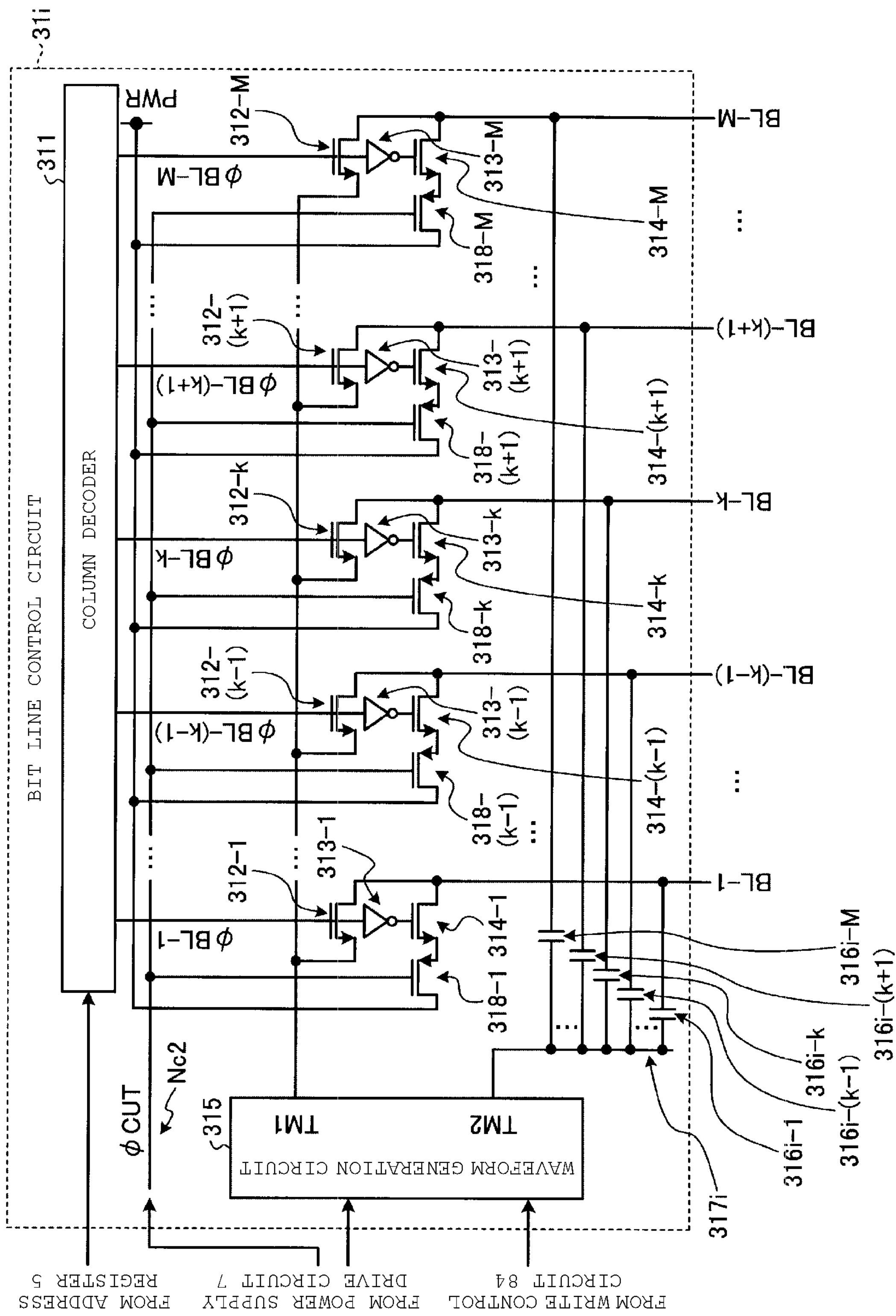
FIG. 12 is a diagram illustrating a bit line control circuit according to the first modification example.

In the same manner, a bit line control circuit 31*i* includes capacitive elements 316*i*-1 to 316*i*-M, a drive line 317*i*, and disconnection switches 318-1 to 318-N, as illustrated in FIG. 12. FIG. 12 is a diagram illustrating a configuration of the bit line control circuit 31*i* according to the first modification example of the embodiment. The capacitive elements 316*i*-1 to 316*i*-M correspond to the bit lines BL-1 to BL-M. One end of the capacitive element 316*i*-1 is connected to the drive line 317*i*, and the other end thereof is connected to the corresponding bit line BL-1. One end of the capacitive element 316*i*-M is connected to the drive line 317*i*, and the other end thereof is connected to the corresponding bit line BL-M. The disconnection switches 318-1 to 318-N correspond to the bit lines BL-1 to BL-M. Each of the disconnection switches 318-1 to 318-M is, for example, a PMOS transistor, and include a gate connected to a control node Nc2, a source connected to the source of each of the selection switches 312-1 to 312-M, and a drain connected to the power supply potential PWR. The disconnection control signal ϕCUT is supplied from the power supply drive circuit 7 to the control node Nc2.

The column decoder 311 sets the control signal ϕBL corresponding to the selected bit line among the M control signals ϕBL-1 to ϕBL-M (see FIG. 8) to an active level (for example, H level) and sets the control signal corresponding to the unselected bit line to an inactive level (for example, L level), in response to an address signal received from the address register 5. According to this, the selection switch 312 corresponding to the selected bit line BL among the M selection switches 312-1 to 312-M is turned on to connect the terminal TM1 of the waveform generation circuit 315 to the unselected bit line BL, and the non-selection switch 314 corresponding to the unselected bit line BL is turned on to connect the power supply potential PWR to the unselected bit line BL via the disconnection switch 318. Thereafter, if the disconnection control signal ϕCUT changes from the inactive level (for example, L level) to the active level (for example, H level), the disconnection switch 318 is turned off to make the unselected bit line BL enter a floating state. Thereby, a voltage not including an overshoot generated by the waveform generation circuit 315 can be selectively supplied to the selected bit line BL, and a voltage including the overshoot generated by the waveform generation circuit 315 can be selectively supplied to the selected bit line BL via the drive line 317*i* and the capacitive element 316*i*. Thereafter, the overshoot of the voltage from the waveform generation circuit 315 ends and the voltage goes to a level corresponding to the selection potential. Thereafter, if the disconnection control signal ϕCUT returns from the active level (for example, H level) to the inactive level (for example, L level), the disconnection switch 318 is turned on and the unselected bit line BL is connected to the power supply potential PWR again. Thereafter, the row decoder 211 sets the control signal ϕWL corresponding to the selected word line to the inactive level (for example, L level).

With such a configuration, it is also possible to rewrite proper information while securing a wide read margin.

Alternatively, instead of temporarily overshooting the potential of the selected word line to a potential higher than the selection potential and then returning to selection potential after the overshoot period, two different selection potentials may be utilized, and the potential of the selected word line may temporarily be set to a higher selection potential and then set to a normal selection potential.

Figure 13:
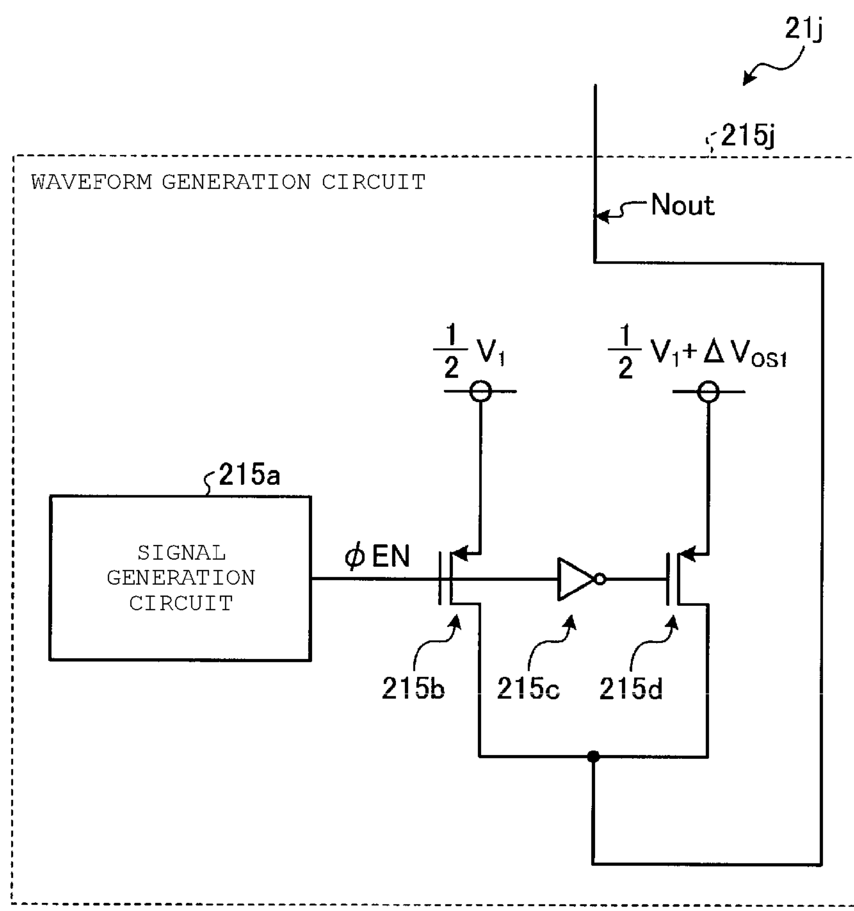
FIG. 13 is a diagram illustrating a waveform generation circuit according to a second modification example.

For example, the waveform generation circuit 215*j* in the word line control circuit 21*j* can be configured as illustrated in FIG. 13. FIG. 13 is a diagram illustrating a configuration of the waveform generation circuit 215*j* according to a second modification example of the embodiment.

The waveform generation circuit 215*j* includes a signal generation circuit 215*a*, a switch 215*b*, an inverter 215*c*, and a switch 215*d*. The signal generation circuit 215*a* generates an enable signal ϕEN in response to a control signal received from the write control circuit 84. The enable signal ϕEN can become a low active signal. The switch 215*b* may be a PMOS transistor. The switch 215*b* receives the enable signal ϕEN, is turned off during a period in which the enable signal ϕEN is at an inactive level (for example, H level) to electrically disconnect a power supply potential ($\frac{1}{2}\times V_1$) from an output node Nout, and is turned on during a period in which the enable signal ϕEN is at an active level (for example, L level) to electrically connect the power supply potential ($\frac{1}{2}\times V_1$) to the output node Nout. The inverter 215*c* generates an enable signal /ϕEN obtained by logically inverting the enable signal ϕEN, and supplies the enable signal /ϕEN to the switch 215*d*. The enable signal /ϕEN can become a low active signal. The switch 215*d* can be configured with a PMOS transistor. The switch 215*d* receives the enable signal /ϕEN, is turned on during a period in which the enable signal /ϕEN is at an active level (for example, L level) to electrically connect the power supply potential ($\frac{1}{2}\times V_1+\Delta V_{OS1}$) to the output node Nout, and is turned off during a period in which the enable signal /ϕEN is at an inactive level (for example, H level) to electrically disconnect the power supply potential ($\frac{1}{2}\times V_1+\Delta V_{OS1}$) from the output node Nout.

The same configuration modification as the modification applied to the waveform generation circuit 215*j* can also be applied to the waveform generation circuit in a bit line control circuit.

Figure 14:
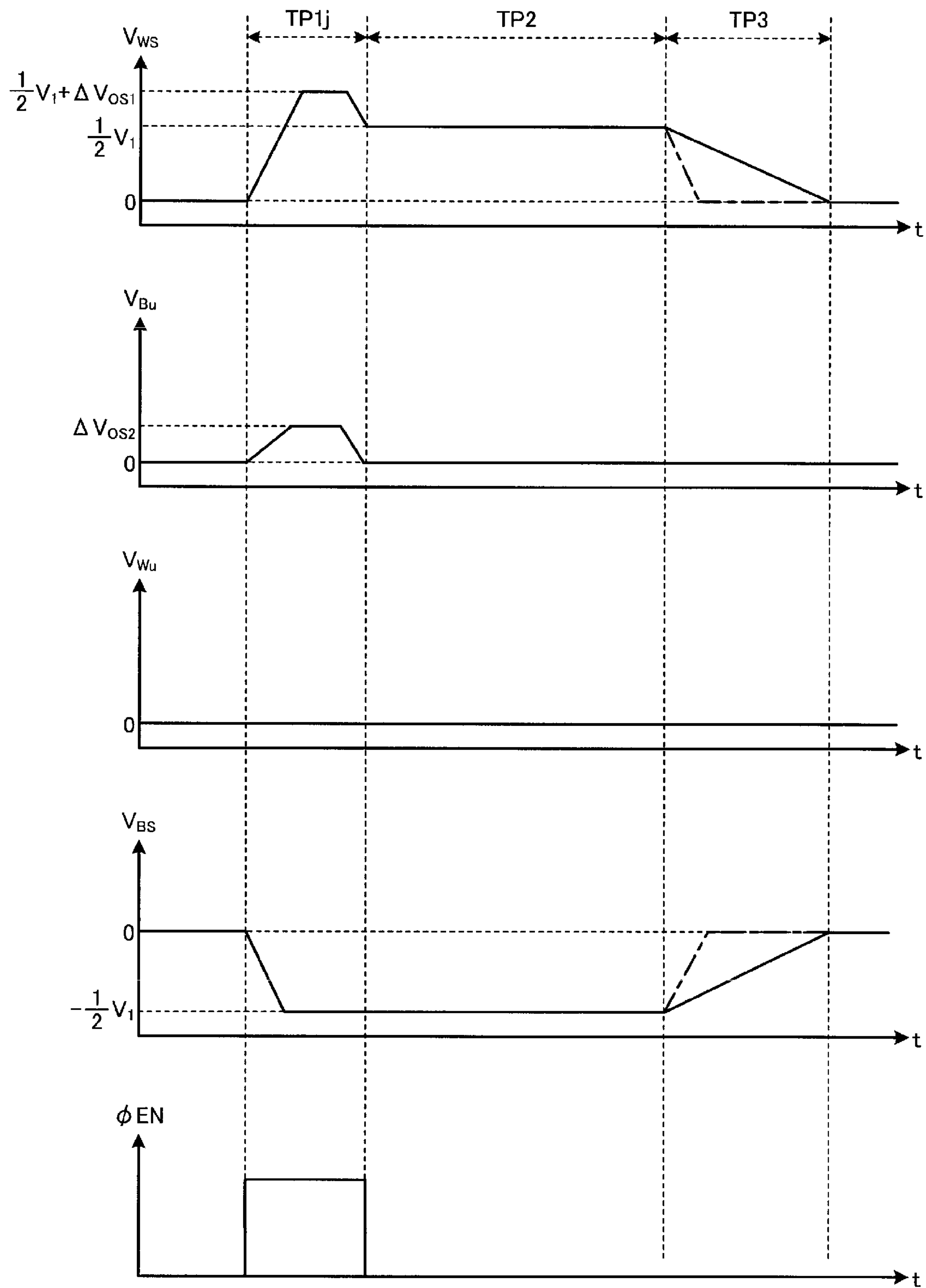
FIG. 14 is a waveform diagram illustrating aspects of an operation of rewriting information to a nonvolatile memory according to the second modification example.

In this case, the information rewriting operation of the nonvolatile memory 200 differs in the following point as illustrated in FIG. 14. FIG. 14 is a waveform diagram illustrating an information rewriting operation of the nonvolatile memory 200 according to the second modification example.

During a period TP1*j*, the control circuit CL sets the enable signal ϕEN to an H level, thereby, maintaining the potential $V_{WS}$ of the selected word line WL at a potential (for example, $\frac{1}{2}\times V_1+\Delta V_{OS1}$, $\Delta V_{OS1}>0$) higher than the selection potential. The control circuit CL increases the potential $V_{WS}$ of the selected word line WL from the reference potential (ground potential) to a predetermined potential ($\frac{1}{2}\times V_1+\Delta V_{OS1}$) beyond the selection potential ($\frac{1}{2}\times V_1$) to maintain for a predetermined time, and thereafter, sets the potential $V_{WS}$ of the selected word line WL to the selection potential ($\frac{1}{2}\times V_1$). According to this, the control circuit CL increases the potential $V_{BU}$ of the unselected bit line BL from the non-selection potential (ground potential) to a predetermined potential ($\Delta V_{OS2}$) to maintain for a predetermined time, and thereafter, returns the potential $V_{BU}$ of the unselected bit line BL to the non-selection potential (ground potential).

During the periods TP2 and TP3, the control circuit CL sets the enable signal ϕEN to the L level. According to this, the same operations as described above can be performed.

With such an operation, it is also possible to rewrite proper information while securing a wide read margin.

Alternatively, instead of temporarily overshooting the potential of the selected word line to a potential higher than the selection potential and then maintained at the selection potential after the overshoot period, the potential of the selected bit line can be temporarily undershot to a potential lower than the selection potential and then maintained at the selection potential after the undershoot period, and thereby, an operation of temporarily applying a voltage higher than the voltage $V_1$ to the selected memory cell MC and then applying the voltage $V_1$ may be performed.

Figure 15:
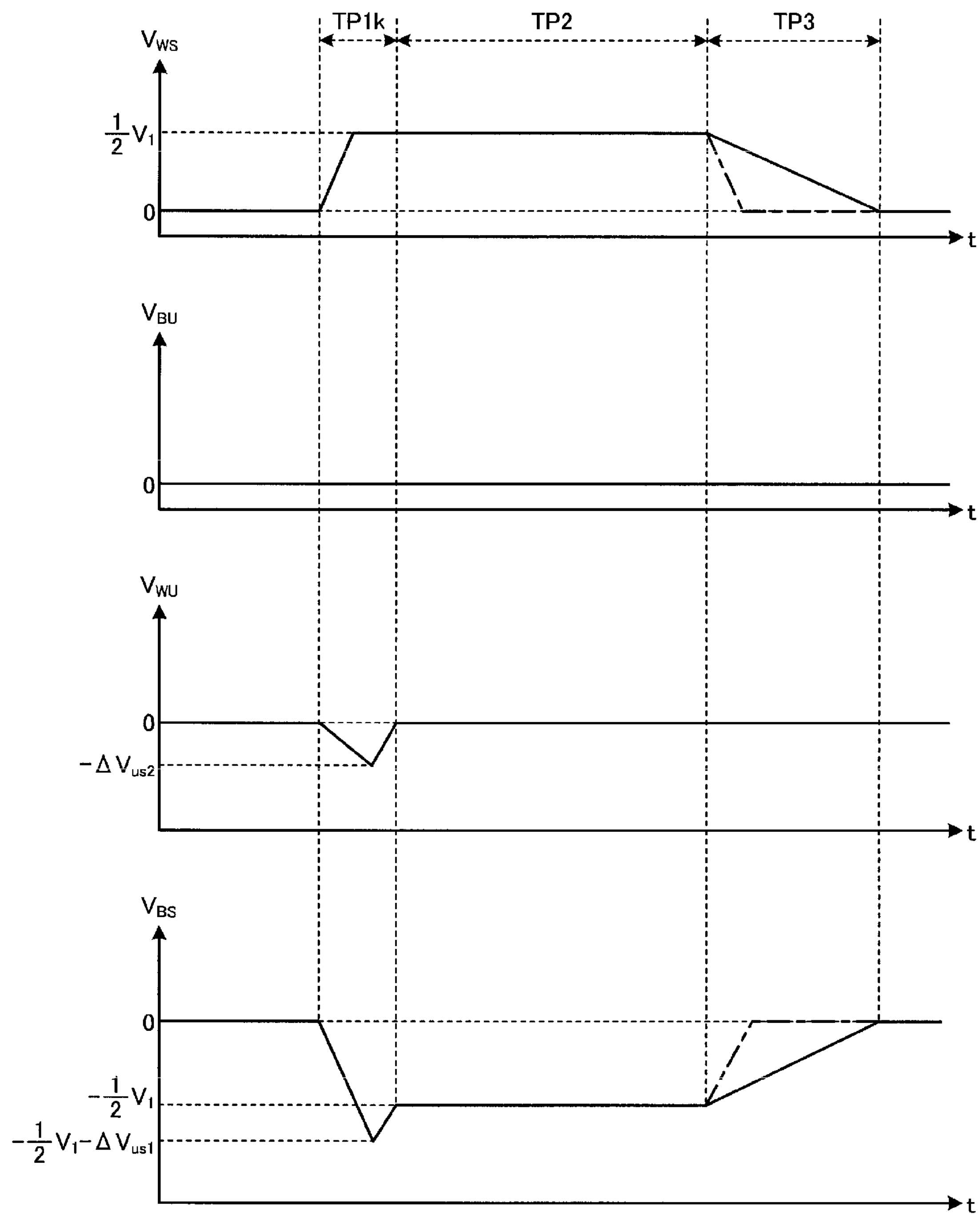
FIG. 15 is a waveform diagram illustrating aspects of an operation of rewriting information to a nonvolatile memory according to a third modification example.

In this case, the information rewriting operation of the nonvolatile memory 200 differs in the following point as illustrated in FIG. 15. FIG. 15 is a waveform diagram illustrating the information rewriting operation of the nonvolatile memory 200 according to a third modification example.

During the period TP1*k*, the control circuit CL sets the potential $V_{BS}$ of the selected bit line BL to a potential (for example, $-\frac{1}{2}\times V_1-\Delta V_{US1}$) lower than the nominal selection potential. The control circuit CL controls a waveform of the potential $V_{BS}$ of the selected bit line BL to change from a reference potential (ground potential) to a predetermined potential ($-\frac{1}{2}\times V_1-\Delta V_{US1}$, $\Delta V_{US1}>0$) below the selection potential ($-\frac{1}{2}\times V_1$), thereby, setting the potential $V_{BS}$ of the selected bit line BL to a potential lower than the nominal selection potential. At the same time, the control circuit CL changes the potential $V_{WS}$ of the selected word line WL to the selection potential (for example, $\frac{1}{2}\times V_1$) and maintains this increased potential.

In addition, since the potential $V_{BS}$ of the selected bit line BL is being undershot, the control circuit CL sets the potential $V_{WU}$ of the unselected word line WL to a potential (for example, $-\Delta V_{US2}$, $\Delta V_{US2}>0$) lower than the nominal non-selection potential (ground potential). As illustrated in FIG. 15, the control circuit CL controls a waveform of the potential $V_{WU}$ to undershoot the non-selection potential (ground potential) by a predetermined potential ($-\Delta V_{US2}$). The undershot amount ($\Delta V_{US2}$) of the potential $V_{WU}$ can be set to be equal to or more than the undershot amount ($\Delta V_{US1}$) of the potential $V_{BS}$.

Figure 16A:
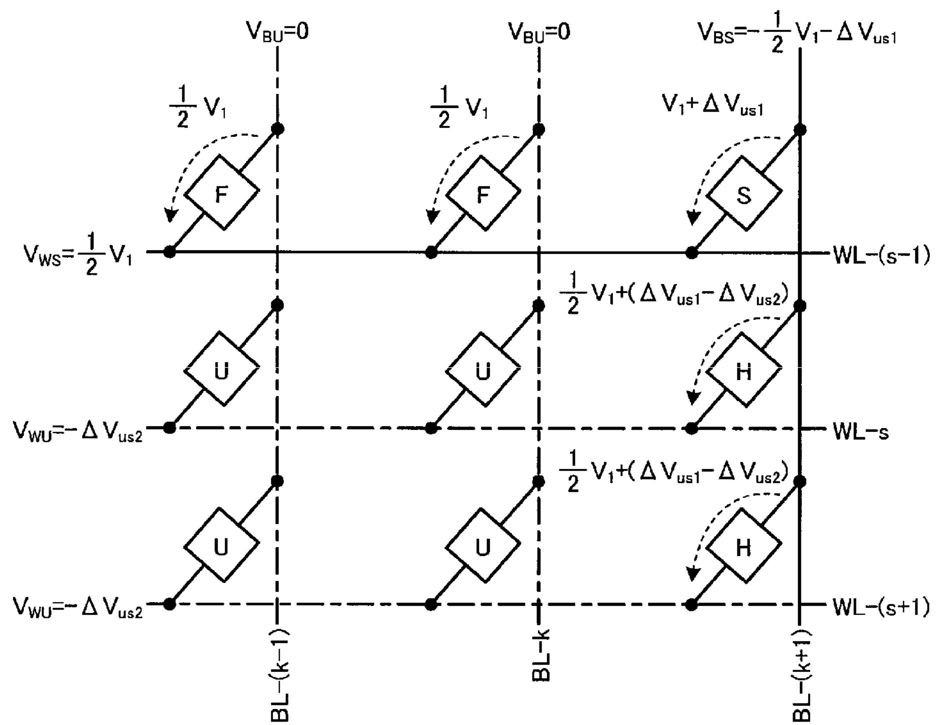
FIGS. 16A and 16B are diagrams illustrating voltages applied to a memory cell according to the third modification example.
Figure 16B:
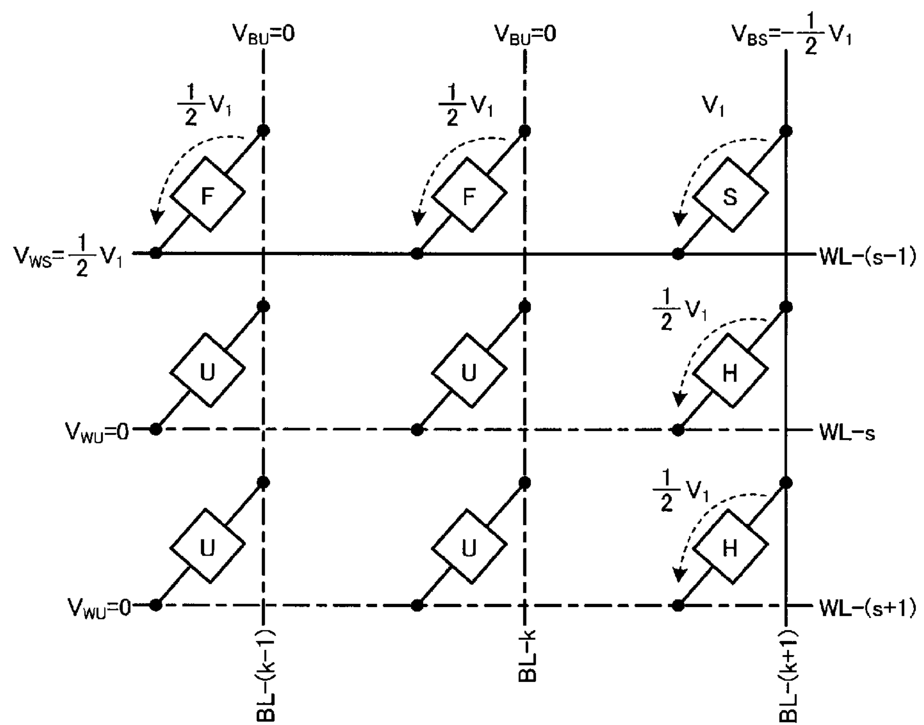

Thereby, a voltage of $V_{WU}-V_{BS}=\frac{1}{2}\times V_1+(\Delta V_{US1}-\Delta V_{US2})$ for which $V_{WU}V_{BS}\leq\frac{1}{2}\times V_1$, is applied across the half-selected memory cell "H" illustrated in FIG. 16A, and thereby, it is possible to prevent a snapback phenomenon from occurring. FIGS. 16A and 16B are diagrams illustrating voltages applied to the memory cell MC according to a third modification example.

During the periods TP2 and TP3, an operation is the same as the operation in the example as illustrated in FIGS. 15 to 16B.

With such an operation, a voltage higher than the voltage $V_1$ can also be temporarily applied to the memory cell MC at the start of the rewriting and then the voltage $V_1$ can be applied thereafter, and thus, it is possible to rewrite appropriate information while securing a wide read margin.

Alternatively, instead of temporarily undershooting the potential of the selected bit line to a potential lower than the nominal selection potential and then setting the potential to the selection potential, two selection potentials can be utilized, and the potential of the selected bit line may be temporarily set to a lower selection potential and then set to a normal selection potential.

Figure 17:
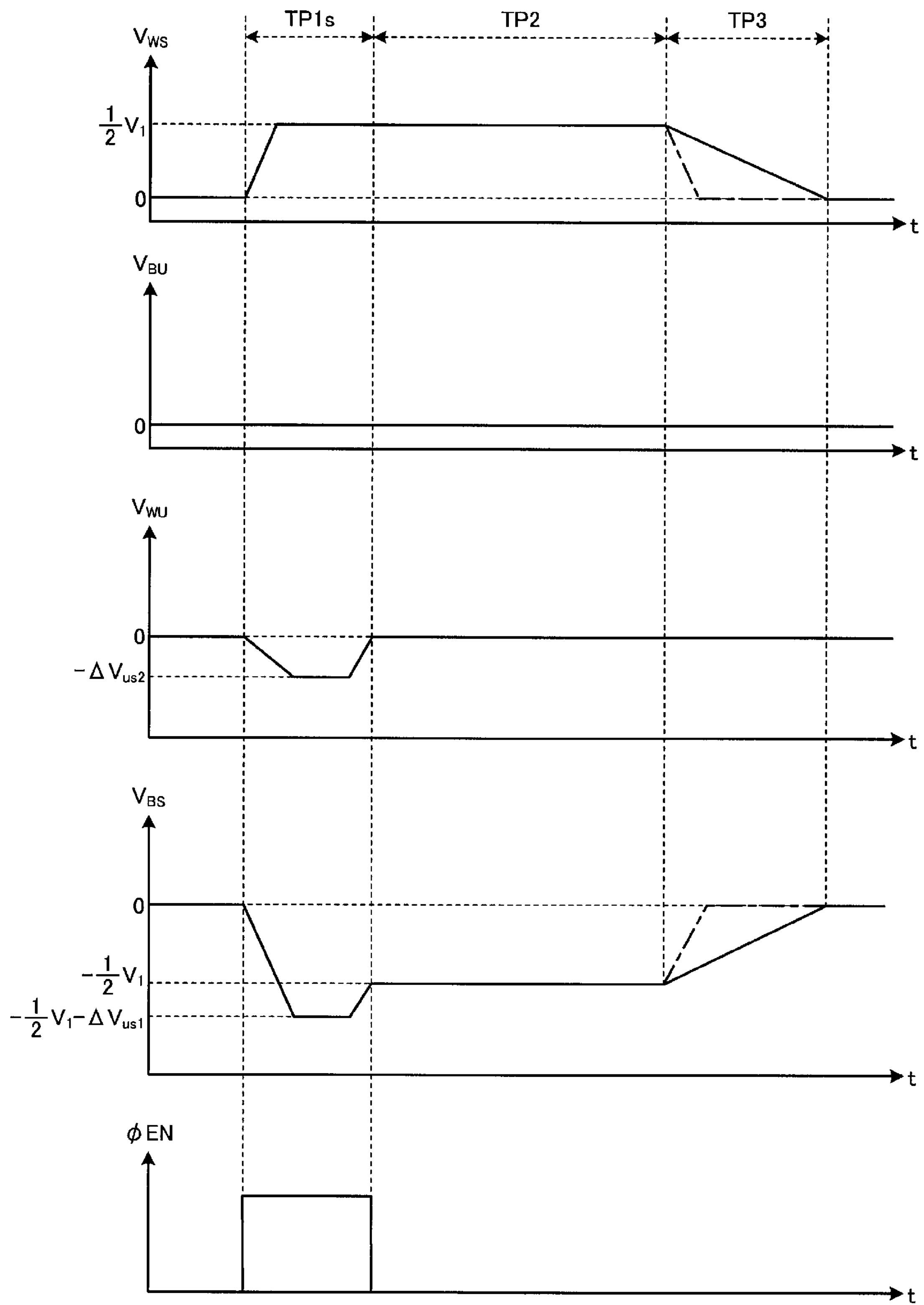
FIG. 17 is a waveform diagram illustrating aspects of an operation of rewriting information to a nonvolatile memory according to a fourth modification example.

In this case, the information rewriting operation of the nonvolatile memory 200 differs in the following point as illustrated in FIG. 17. FIG. 17 is a waveform diagram illustrating the information rewriting operation of the nonvolatile memory 200 according to the fourth modification example.

During a period TP1*s*, the control circuit CL maintains the potential $V_{BS}$ of the selected bit line BL at a potential (for example, $-\frac{1}{2}\times V_1-\Delta V_{US1}<-\frac{1}{2}\times V_1$) lower than the nominal selection potential. The control circuit CL decreases the potential $V_{BS}$ of the selected bit line BL from the reference potential (ground potential) to a predetermined potential ($-\frac{1}{2}\times V_1-\Delta V_{US1}$) below the selection potential ($-\frac{1}{2}\times V_1$) and maintains this potential for a predetermined time, and thereafter, the potential $V_{BS}$ of the selected bit line BL is set to the selection potential ($-\frac{1}{2}\times V_1$). According to this, the control circuit CL decreases the potential $V_{WU}$ of the unselected word line WL from the non-selection potential (ground potential) to a predetermined potential ($-\Delta V_{US2}$) and maintains this potential for a predetermined time, and thereafter, the potential $V_{WU}$ of the unselected word line WL is returned to the non-selection potential (ground potential).

During the periods TP2 and TP3, the same operation as in the first embodiment can be performed.

With such an operation, it is also possible to rewrite appropriate information while securing a wide read margin.

In addition to a rectification element such as a diode, the rectification element D may be, for example, a switching element disposed between two terminals. In a case where a voltage applied across the two terminals is lower than a threshold value, the switching element is in a "high resistance" state, for example, an electrically open or disconnected state. In a case where the voltage applied across the two terminals is equal to or higher than the threshold value, the switching element changes to a "low resistance state", for example, an electrically closed or connected state. The switching element may have this function for either polarity of a voltage. The switching element may contain at least one chalcogen element selected from a group consisting of Te, Se and S. Alternatively, the switching element may contain a chalcogenide that is a compound including a chalcogen element. In addition to this, the switching element may contain at least one element selected from a group consisting of B, Al, Ga, In, C, Si, Ge, Sn, As, P, and Sb.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device, comprising:

a first conductor that extends in a first direction;

a second conductor that extends in a second direction;

a first memory cell connected between the first conductor and the second conductor and including a phase change element; and a control circuit configured to apply:

a first voltage across the first memory cell via the first conductor and the second conductor during a first period of time of a write operation targeted to the first memory cell, and a second voltage across the first memory cell via the first conductor and the second conductor during a second period of time of the write operation after the first period, wherein the first voltage is an overshoot voltage having a magnitude greater than the second voltage, the second voltage is a preset voltage of the write operation having a magnitude sufficient to place the phase change element in a molten state during the second period of time, the control circuit applies:

the first voltage across the first memory cell during the first period of time by setting the first conductor to a potential having a magnitude greater than a first selection potential and the second conductor to a second selection potential, and the second voltage across the first memory cell during the second period of time by setting the first conductor to the first selection potential and the second conductor to the second selection potential, the first selection potential has a magnitude equal to one-half of the second voltage, and the second selection potential has a magnitude equal to the first selection potential and a polarity opposite of the first selection potential.

2. The semiconductor memory device according to claim 1, further comprising:

a third conductor that extends in the first direction;

a fourth conductor that extends in the second direction;

a second memory cell that connected between the first conductor and the fourth conductor; and a third memory cell connected between the second conductor and the third conductor, wherein the control circuit applies:

a first non-selection potential to the third conductor during the first period, a potential to the fourth conductor having a magnitude greater than the first non-selection potential during the first period, and the first non-selection potential to the third conductor and the fourth conductor during the second period.

3. The semiconductor memory device according to claim 1, wherein the control circuit is configured to apply:
the first selection potential to the first conductor and a third selection potential having a magnitude greater than the second selection potential to the second conductor during the first period, and
the first selection potential to the first conductor and the second selection potential to the second conductor during the second period,
the first selection potential has a first polarity,
the second selection potential has a second polarity opposite of the first polarity, and
the third selection potential has the second polarity.

4. The semiconductor memory device according to claim 3, further comprising:
a third conductor that extends in the first direction;
a fourth conductor that extends in the second direction;
a second memory cell connected between the first conductor and the fourth conductor; and
a third memory cell connected between the second conductor and the third conductor, wherein
the control circuit applies:
a first non-selection potential to the fourth conductor and a second non-selection potential to the third conductor during the first period, the second non-selection potential having a magnitude greater than the first non-selection potential, and
the first non-selection potential to the third conductor and the fourth conductor during the second period.

5. The semiconductor memory device according to claim 1, wherein the phase change element switches between a high resistance state and a low resistance state according to a control of a cooling rate from the molten state to a solidified state after the second period of time.

6. The semiconductor memory device according to claim 1, wherein
the phase change element has a low crystallinity state that is a high resistance state and a high crystallinity state that is a low resistance state, and
the phase change material is a chalcogenide-based material.

7. The semiconductor memory device according to claim 1, wherein the semiconductor memory device is a cross-point type memory device having a plurality of memory cells, the first conductor is a word line in a plurality of word lines, and the second conductor is a bit line in a plurality of bit lines.

8. The semiconductor memory device according to claim 1, wherein a voltage across the first memory cell is maintained at the first voltage during the first period of time of the write operation.

9. A semiconductor memory device, comprising:
a plurality of word lines extending in a first direction;
a plurality of bit lines extending in a second direction crossing the first direction;
a plurality of memory cells, each memory cell being connected to one word line and one bit line and including a phase change element; and
a control circuit configured to apply:
a first voltage across a selected memory cell via a selected word line of the plurality of word lines and a selected bit line of the plurality of bit lines during a first period of time of a write operation targeted to the selected memory cell, and
a second voltage across the selected memory cell via the selected word line and the selected bit line during a second period of time of the write operation after the first period, wherein
the first voltage is an overshoot voltage having a magnitude greater than the second voltage,
the second voltage is a preset voltage of the write operation having a magnitude sufficient to place the phase change element of the selected memory cell in a molten state during the second period of time, and
the control circuit applies:
the first voltage across the selected memory cell during the first period of time by setting the selected word line to a potential having a magnitude greater than a first selection potential and the selected bit line to a second selection potential, and
the second voltage across the selected memory cell during the second period of time by setting the selected word line to the first selection potential and the selected bit line to the second selection potential.

10. The semiconductor memory device according to claim 9, wherein
the first selection potential has a magnitude equal to one-half of the second voltage, and
the second selection potential has a magnitude equal to the first selection potential and a polarity opposite of the first selection potential.

11. The semiconductor memory device according to claim 9, wherein the control circuit applies:
a first non-selection potential to an unselected word line connected to a memory cell connected to the selected bit line during the first period,
a potential to an unselected bit line connected to a memory cell connected to the selected word line, the potential having a magnitude greater than the first non-selection potential during the first period, and
the first non-selection potential to the unselected word line and the unselected bit line during the second period.

12. The semiconductor memory device according to claim 9, wherein
the control circuit is configured to apply:
the first selection potential to the selected word line and a third selection potential having a magnitude greater than the second selection potential to the selected bit line during the first period, and
the first selection potential to the selected word line and the second selection potential to the selected bit line during the second period,
the first selection potential has a magnitude equal to one-half of the second voltage and a first polarity,
the second selection potential has a magnitude equal to the first selection potential and a second polarity opposite of the first polarity, and
the third selection potential has the second polarity.

13. The semiconductor memory device according to claim 12, wherein the control circuit applies:
during the first period, a first non-selection potential to an unselected bit line connected to a memory cell connected to the selected word line and a second non-selection potential to an unselected word line connected to the selected bit line, the second non-selection potential having a magnitude greater than the first non-selection potential, and
during the second period, the first non-selection potential to the unselected word line and the unselected bit line.

14. The semiconductor memory device according to claim 9, a voltage across the selected memory cell is maintained at the first voltage during the first period of time of the write operation.

15. A method of performing a write operation, comprising:
applying a first voltage across a selected memory cell of a semiconductor memory device via a word line and a bit line during a first period of time of a write operation targeted at the selected memory cell, and
applying a second voltage across the selected memory cell via the word line and the bit line during a second period of time of the write operation after the first period, wherein
the first voltage is an overshoot voltage having a magnitude greater than the second voltage,
the second voltage is a preset voltage of the write operation having a magnitude sufficient to place a phase change element of the selected memory cell in a molten state during the second period of time,
the first voltage across the selected memory cell during the first period of time is applied by setting the selected word line to a potential having a magnitude greater than a first selection potential and the selected bit line to a second selection potential,
the second voltage across the selected memory cell during the second period of time is applied by setting the selected word line to the first selection potential and the selected bit line to the second selection potential,
the first selection potential having a magnitude equal to one-half of the second voltage, and
the second selection potential having a magnitude equal to the first selection potential and a polarity opposite of the first selection potential.

16. The method of claim 15, wherein
the first voltage across the selected memory cell during the first period of time is applied by setting the selected word line to a first selection potential and the selected bit line to a third selection potential having a magnitude greater than a second selection potential,
the second voltage across the selected memory cell during second period of time is applied by setting the selected word line to the first selection potential and the selected bit line the second selection potential,
the first selection potential having a first polarity,
the second selection potential having a second polarity opposite of the first polarity, and
the third selection potential having the second polarity.

17. A semiconductor memory device, comprising:
a first conductor that extends in a first direction;
a second conductor that extends in a second direction crossing the first direction;
a third conductor that extends in parallel with the first conductor in the first direction;
a fourth conductor that extends in parallel with the second conductor in the second direction;
a first memory cell sandwiched between the first conductor and the second conductor in a third direction crossing the first and second directions, the first memory cell connected to the first conductor and the second conductor and including a first phase change element and first rectification element connected in series;
a second memory cell sandwiched between the first conductor and the fourth conductor in the third direction, the second memory cell connected to the first conductor and the fourth conductor and including a second phase change element and a second rectification element connected in series;
a third memory cell sandwiched between the third conductor and the second conductor in the third direction, the third memory cell connected to the third conductor and the second conductor and including a third phase change element and a third rectification element connected in series;
a fourth memory cell sandwiched between the third conductor and the fourth conductor in the third direction, the fourth memory cell connected to third conductor and the fourth conductor and including a fourth phase change element and fourth rectification element connected in series; and
a control circuit configured to apply, during a write operation targeted to the first memory cell:
a first potential to the first conductor in a first period of the write operation, the first potential having an absolute magnitude greater than a first selection potential,
the first selection potential to the first conductor during a second period of the write operation, the second period being after the first period,
a second selection potential to the second conductor during the first and second periods of the write operation,
a first non-selection potential to the third conductor during the first and second periods of the write operation,
a second potential having an absolute magnitude greater than a second non-selection potential to the fourth conductor during the first period, and
the second non-selection potential to the fourth conductor during the second period of the write operation.

18. The semiconductor memory device according to claim 17, wherein
the first non-selection potential is equal to ground potential, and
the second non-selection potential is equal to ground potential.

* * * * *